United States Patent
Hutson et al.

(10) Patent No.: US 11,159,157 B2
(45) Date of Patent: Oct. 26, 2021

(54) CIRCUITRY FOR PROVIDING DIGITALLY STABLE GROUND

(71) Applicant: Ubicquia LLC, Melbourne, FL (US)

(72) Inventors: Bradford Brian Hutson, Melbourne, FL (US); Ronald B. Zimmerman, III, Melbourne, FL (US); Ian B. Aaron, Melbourne, FL (US); Yevgeny Frenkel, Melbourne, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 137 days.

(21) Appl. No.: 16/569,467

(22) Filed: Sep. 12, 2019

(65) Prior Publication Data

US 2020/0083883 A1    Mar. 12, 2020

Related U.S. Application Data

(60) Provisional application No. 62/730,365, filed on Sep. 12, 2018.

(51) Int. Cl.
| | |
|---|---|
| *H03K 17/61* | (2006.01) |
| *H04W 4/80* | (2018.01) |
| *G06F 1/3206* | (2019.01) |
| *H05B 47/26* | (2020.01) |
| *H02M 1/08* | (2006.01) |

(52) U.S. Cl.
CPC .......... *H03K 17/61* (2013.01); *G06F 1/3206* (2013.01); *H02M 1/081* (2013.01); *H04W 4/80* (2018.02); *H05B 47/26* (2020.01)

(58) Field of Classification Search
None
See application file for complete search history.

(56) References Cited

U.S. PATENT DOCUMENTS

| | | | | |
|---|---|---|---|---|
| 9,746,498 B2* | 8/2017 | Roberson | ............... | G01R 15/04 |
| 9,748,759 B1* | 8/2017 | Bergeron | ............. | H02H 1/0007 |
| 10,361,015 B1* | 7/2019 | Skidmore | ............. | H01B 7/365 |

* cited by examiner

*Primary Examiner* — Rexford N Barnie
*Assistant Examiner* — Terrence R Willoughby
(74) *Attorney, Agent, or Firm* — Daniel C. Crilly; Thomas J. Satagaj

(57) ABSTRACT

A circuit is provided for converting alternating current power into direct current (DC) power and providing a digitally stable ground for operation of a processor-based device. Embodiments of the circuit include a transformer isolating (e.g., via galvanic isolation) a primary side from a secondary side of the circuit. A controller (e.g., a pulse width modulation (PWM) controller) on the primary side directs a switching circuit to selectively permit current flow through a primary side of the transformer to a first ground node on the primary side. A secondary winding of the transformer sources a rectified DC output relative to a second ground node that is isolated from the first ground node. In some cases, compensation on the secondary winding side provides isolated feedback to the controller via an optical isolator or some other circuit. The controller directs the switching circuit based at least in part on the error correction feedback and input from an auxiliary winding of the transformer.

20 Claims, 8 Drawing Sheets ial Patent Application No. 62/730,365, filed Sep. 12, 2018, which application is hereby incorporated by reference in its entirety.

CIRCUITRY FOR PROVIDING DIGITALLY STABLE GROUND

CROSS-REFERENCE TO RELATED APPLICATIONS

This application claims the priority benefit of U.S. Provisional Patent Application No. 62/730,365, filed Sep. 12, 2018, which application is hereby incorporated by reference in its entirety.

BACKGROUND

Technical Field

The present disclosure generally relates to a circuit for converting mains power into direct current power devices and providing a digitally stable ground for operation of processor-based devices.

Description of the Related Art

Power lines transport electricity from one locale to another; sometimes over great distances. In many cases, the power lines pass over, through, or otherwise in proximity to areas populated by people and other living things. Often, the power lines are "tapped" to provide electricity at one or more points. This "tapping" permits power passing over the power lines to be diverted for consumption by street lights, street signs, traffic lights, businesses, homes, and for other things.

The quality of the electricity that is on the power lines, and the quality of the power that is tapped from the power lines, may vary. For example, voltage, frequency, power factor, and other characteristics of the electricity at one point, such as a pole (e.g., a power pole, a street light pole, or the like), may be different from the same characteristic at another pole, even if the poles are adjacent, and even if the characteristic is expected to be the same. At least some of the reasons for this variation include one or more particular loads that draw power from the power lines, failure or other aberrant conditions of equipment coupled to the power lines, and variations in the source of the power passing over the power lines.

In many cases, the quality of the power passing on the power lines does not cause any problems. That is, at least generally speaking, incandescent lights, motors, heating elements, and other such devices can all operate with power that may have widely varying characteristics without any noticeable effects. On the other hand, in cases where variations in the quality of the power drawn from the power lines is a problem, the problem is addressed at the point where the power is consumed. For example, when a home or business uses the power to operate an electronic device, the electronic device will "clean" the power prior to applying the power to the electronic components.

Another known issue with power lines is referred to herein as "stray voltage." In many power transmission systems, the power lines consist of one or more power carrying transmission conduits (e.g., "hot" lines, load lines, and the like) and one or more non-power carrying transmission conduits (i.e., "neutral" lines). A neutral line provides a reference plane for the one or more hot power lines, and typically, the neutral line provides a return path for the electricity consumed by the load device. Additionally, an exposed chassis of the load device will also be electrically coupled to earth ground. The earth ground connection is a protection device for lightning strikes and other conditions where an exposed chassis of the load device, the structures supporting the load device, and the like are spontaneously electrically coupled to a power source. In typical power transmission systems, each chassis and supporting pole structure will be electrically coupled to earth ground. It is known, however, that in cases of improper grounding, mis-wiring of equipment, equipment failure, failure in insulation around a hot power line conduit, capacitive coupling between energized lines and non-energized lines (e.g., unconnected adjacent wiring), and in other circumstances, a neutral line may become a power carrying conduit and/or the neutral line may become electrically coupled to the earth ground line. In these cases, an electric potential (i.e., the stray voltage) present on the earth ground line may be dangerous to people and other living things. Pedestrians, pets and others may come into contact with this stray voltage at a fence, a metal streetlight support, a traffic signal controller cabinet, a utility access cover, and even concrete surfaces of sidewalks or driveways may be dangerously electrified.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments described in this disclosure (i.e., the teachings of this disclosure) are directed to processor-based devices that are directly coupled to mains power transmission lines. The processor-based devices may, for example, be embodied as small-cell or other smart device that is electromechanically couplable to a streetlight via a standardized socket integrated in the streetlight housing. The teaching of this disclosure discusses various circuitry embodiments that generate direct current (DC) power from the mains alternating current (AC) power and further generate a digitally stable ground that can be used in the processor-based circuits. In at least some cases, the teaching of the disclosure also discusses circuitry embodiments that detect and isolate stray voltage signals in or around the device housing, which may be dangerous to living things that contact the device or a structure electrically coupled to the device.

In a first embodiment, a processor-based device, comprises: a chassis having a chassis ground node, the chassis ground node arranged to electrically couple the chassis to an earth ground; a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors conform to a standardized powerline interface, and wherein the standardized powerline interface includes at least a hot power signal, a load power signal, and a neutral power signal; a processor-based apparatus housed at least in part within the chassis, the processor-based apparatus arranged to operate using direct current (DC) power relative to a digitally stable ground; first circuitry to convert alternating current (AC) power received at the first connector into the DC power and to provide the digitally stable ground; and second circuitry to detect a stray voltage potential between the neutral power signal of the standardized powerline interface and the chassis ground node, wherein the processor-based device is further arranged to communicate at least one indication of the detected stray voltage potential.

In some cases of the first embodiment, the standardized powerline interface conforms to a standard provided by the National Electrical Manufacturers Association (NEMA). In these and other cases, the second connector is integrated in a luminaire.

In some cases of the first embodiment, the first circuitry to convert the AC power into the DC power and to provide the digitally stable ground, comprises: circuitry inputs arranged to receive mains power via the first connector; a first ground node; a second ground node; a transformer arranged to galvanically isolate the first ground node from the second ground node; a first set of electrical components arranged to rectify and filter the mains power and further arranged to provide filtered and rectified power to a primary winding of the transformer; a solid-state switching device electrically coupled between the primary winding and the first ground node; a pulse width modulation (PWM) controller arranged to control switching of the solid-state switching device; a second set of electrical components electrically coupled to a secondary winding of the transformer and arranged to provide a filtered DC voltage relative to the second ground node, the filtered DC voltage electrically coupled to a direct current output node; and a third set of electrical components electrically coupled between the second ground node and a digitally stable ground node, wherein the digitally stable ground node is galvanically isolated from a mains power ground node.

In these and yet other cases of the first embodiment, the first circuitry to convert the AC power into the DC power and to provide the digitally stable ground, further comprises: an error compensation sub-circuit arranged to provide an error signal based at least in part on the DC voltage output, the error compensation sub-circuit coupled to the second ground node; and an optical isolator arranged to provide a feedback signal to the PWM controller based at least in part on the error signal.

In some cases of the first embodiment, the second circuitry to detect the stray voltage potential between the neutral power signal of the standardized powerline interface and the chassis ground node, comprises: a stray voltage isolation circuit arranged to generate a stray voltage signal; and a stray voltage measurement/processing circuit arranged to: programmatically set a stray voltage threshold; determine when the stray voltage signal has crossed the stray voltage threshold; and communicate an alert based on the determination. In these and other cases, the stray voltage isolation circuit includes at least one Zener diode arranged to provide a voltage-limited stray voltage signal. The alert may include at least one of an audio alert, a visual alert, and a short-range wireless alert. The short-range wireless alert may include a packetized message communicated toward mobile computing devices wirelessly coupled to the processor-based device via a WiFi communication protocol. The alert may include at least one packetized message communicated toward a remote computing device via a cellular-based communication medium.

In a second embodiment, an apparatus arranged for attachment to a luminaire having one or more light emitting elements and a receptacle, the apparatus comprises: a housing; a connector accessible from an exterior of the housing, the connector including a set of connector elements that interface with corresponding receptacle elements of the receptacle of the luminaire; one or more processor-based devices housed at least in part within the housing, the one or more processor-based devices being operable by receiving direct current power relative to a digitally stable ground; circuitry for detecting a stray voltage between the housing and a neutral power line signal passed through the connector; and circuitry for converting alternating current (AC) power received at the connector into the direct current power and for providing the digitally stable ground, the circuitry comprising: a pair of circuitry inputs, a first circuitry input connected to a first connector element of the set of connector elements, and a second circuitry input connected to a second connector element of the set of connector elements; a first ground node and a second ground node galvanically isolated from the first ground node; a transformer that galvanically isolates the first ground node from the second ground node, the transformer including a primary winding, a secondary winding coupled to the second ground node, and an auxiliary winding coupled to the first ground node; a first set of electrical components for providing filtered and rectified power to the primary winding; a solid-state switching device connected between the primary winding and the first ground node; a pulse width modulation (PWM) controller that controls switching of the solid-state switching device, the PWM controller powered by power received from the auxiliary winding and coupled to the first ground node; an output capacitor and a diode coupled to the secondary winding and providing a DC voltage output relative to the second ground node; an error compensation subcircuit that provides an error signal based at least in part on the DC voltage output, the error compensation subcircuit coupled to the second ground node; and an optical isolator that provides a feedback signal to the PWM controller based at least in part on the error signal; a direct current output node; and a digitally stable ground galvanically isolated from a mains power ground node.

In some cases of the second embodiment, at least one of the one or more processor-based devices is a wireless communications transceiver for sending and receiving wireless communication signals. In some cases, at least one of the one or more processor-based devices is a camera. And in these and other cases, the apparatus further comprises one or more sensors electronically communicatively coupled to the one or more processor-based devices.

In some cases of the second embodiment, the apparatus further comprises a photocontroller coupled to at least the first connector element and a third connector element of the set of connector elements, the photocontroller including a switching element and a photosensor that selectively causes the switching element to transition between a third state and a fourth state, the third state in which an open circuit is established between the first connector element and the third connector element, and the fourth state in which a closed circuit is established between the first connector element and the third connector element. In some cases, the second connector element is electrically coupled to the first ground node, and in some cases, the the connector is compliant with American National Standards Institute (ANSI) C136.

In a third embodiment, a small cell networking device, comprises: a networking module arranged as a gateway to a cellular-based network, the cellular-based network controlled by a mobile network operator (MNO); a light sensor; a processor-based light control circuit arranged to provide a light control signal based on at least one ambient light signal generated by the light sensor; a connector compliant with a roadway area lighting standard promoted by a standards body, the connector including a set of connector elements that interface with corresponding receptacle elements of a receptacle of a streetlight fixture; circuitry to detect a stray voltage between a housing of the small-cell networking device and a neutral power line signal passed through the connector; and circuitry to convert alternating current (AC) mains power received at the connector into direct current (DC) power and to provide a digitally stable ground, the circuitry to convert the AC mains power comprising: a pair of circuitry inputs, a first circuitry input connected to a first connector element of the set of connector elements, and a second circuitry input connected to a second connector element of the set of connector elements; a first ground node and a second ground node galvanically isolated from the first ground node; a transformer that galvanically isolates the first ground node from the second ground node, the transformer including a primary winding, a secondary winding coupled to the second ground node, and an auxiliary winding coupled to the first ground node; a first set of electrical components for providing filtered and rectified power to the primary winding; a solid-state switching device connected between the primary winding and the first ground node; a pulse width modulation (PWM) controller that controls switching of the solid-state switching device, the PWM controller powered by power received from the auxiliary winding and coupled to the first ground node; an output capacitor and a diode coupled to the secondary winding and providing a DC voltage output relative to the second ground node; an error compensation subcircuit that provides an error signal based at least in part on the DC voltage output, the error compensation subcircuit coupled to the second ground node; an optical isolator that provides a feedback signal to the PWM controller based at least in part on the error signal; a direct current output node; and a digitally stable ground galvanically isolated from a mains power ground node.

In some cases of the third embodiment, an alert generated in response to a detected stray voltage is communicated to a remote computing device via a cellular-based protocol. In these and other cases, the connector is compliant with American National Standards Institute (ANSI) C136.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

DETAILED DESCRIPTION

Figure 1:
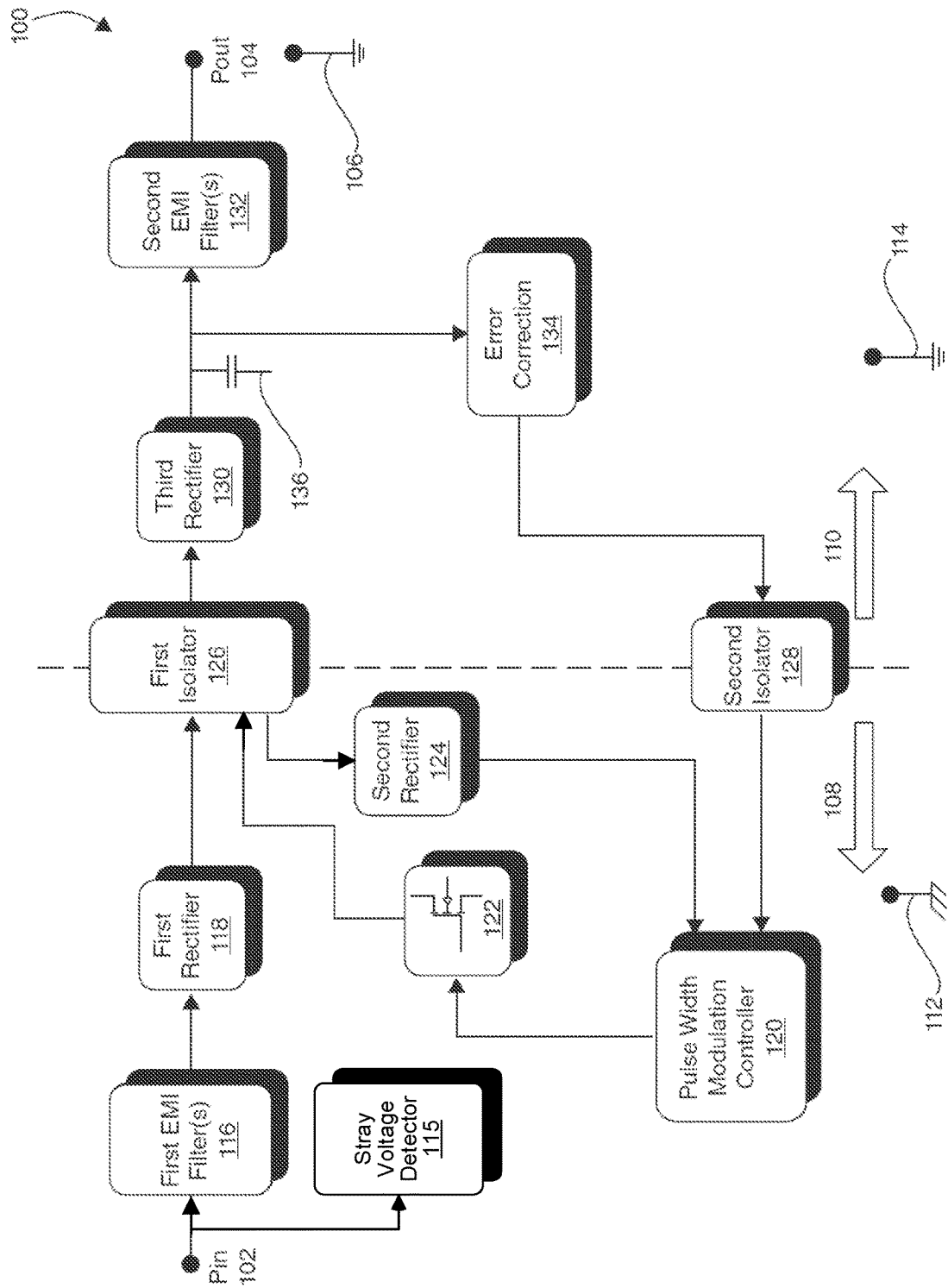
FIG. 1 is a block diagram of a circuit for converting power according to one or more embodiments.

FIG. 1 shows a block diagram depicting elements of a circuit 100 for converting alternating current (AC) power input 102 into direct current (DC) power output 104 providing a digitally stable ground 106. It is recognized that such a circuit may also receive a DC power input at 102, however, to avoid obfuscating the teaching of the present disclosure, the mains power inputs of the circuits described herein are discussed as AC power signals. The circuit 100 has a first side 108 that is galvanically isolated from a second side 110 of the circuit 100 via a set of isolation elements. Circuit elements on the first side 108 are grounded with reference to a first ground 112 and circuit elements on the second side 110 are grounded with reference to a second ground 114. The circuit 100 may have a topology similar to some AC/DC flyback power converters. The circuit 100 may be part of an apparatus that operates using DC power and that receives AC mains power from a power grid. As described below, the apparatus may include electrically sensitive components whose effective operation depends on receiving DC power referenced with respect to a digitally stable ground. The operation of such components may be adversely affected as a result of fluctuation in ground potential. The circuit 100 provides DC power output 104 with the digitally stable ground 106 by which such components may reliably operate.

The circuit 100 comprises one or more first electromagnetic interference (EMI) filters 116, a first rectifier 118, a pulse width modulation (PWM) controller 120, one or more solid-state switches 122, a second rectifier 124, a first isolator 126, a second isolator 128, a third rectifier 130, one or more second EMI filters 132, an error correction portion 134, and one or more capacitors 136. Each part of the circuit 100 may include one or more subparts and the circuit 100 may include additional elements not depicted in FIG. 1, as described herein.

The power input 102 is received at the first EMI filter 116, which filters common mode and/or differential mode interference from the AC power. The first EMI filter 116 may include one or more pairs of inductive elements connected in parallel with each other, and may include one or more capacitors connected with the inductive elements. The filtered AC power from the first EMI filter 116 is provided to a first rectifier 118, which converts the filtered AC power into uni-directional pulses of current. The first rectifier 118 may include a diode bridge that provides alternating half-cycles of current, and may further include one or more smoothing capacitors in parallel with the diode bridge to provide a full-wave ripple output to the first isolator 126.

The first isolator 126 transfers power from the first side 108 to the second side 110 while galvanically isolating the first side 108 from the second side 110. The first isolator 126 includes a transformer comprising a primary coil on the first side 108, and a secondary coil on the second side 110. The transformer may include an auxiliary coil on the first side 108 in at least some embodiments. The first isolator 126 may further include one or more semiconductor elements that provide uni-directional current flow. For instance, the first isolator 126 may have a snubber circuit comprising a diode, resistor, and a capacitor to clamp voltage resonating in the transformer as a result of leakage inductance. The second rectifier 124 is connected between the first isolator 126 and the PWM controller 120 providing power having uni-directional current to the PWM controller 120. The second rectifier 124 may include one or more low-pass filters to provide a stable DC voltage to power the PWM controller 120.

In the embodiment of FIG. 1, the PWM controller 120 is connected to a control line (e.g., gate) of the solid-state switch 122. The control line is arranged to transition the solid-state switch 122 between a conducting state, in which current flows through the primary coil winding of the transformer of first isolator 126 to the first ground 112, and a non-conducting state, in which the solid-state switch 122 does not permit current flow through the solid-state switch 122 to the first ground 112. In some embodiments, the primary winding or the auxiliary winding of the transformer of first isolator 126 may be electrically coupled to a control input of the PWM controller 120, which may control switching of the solid-state switch 122 based at least in part on an electrical signal received at the control input. The PWM controller 120 may also have a control input coupled to a terminal of the solid-state switch 122 for controlling the state of the solid-state switch 122 based at least in part on a voltage or a current at the terminal of the solid-state switch 122. In these or still other embodiments, the PWM controller 120 may also control switching of the solid-state switch 122 based on a state of the second side 110 of the circuit 100. For example, the PWM controller 120 may control the solid-state switch 122 based at least in part on a signal received from the second isolator 128, as described herein.

The third rectifier 130 rectifies power provided from the secondary winding of the transformer of the first isolator 126. The third rectifier 130 may include one or more diodes or other switch elements connected to permit current flow in one direction from the secondary winding of the transformer of the first isolator 126 and to prevent current flow in an opposing direction from the secondary winding. The third rectifier 130 may also include passive elements, such as resistors and/or capacitors connected in series and/or in parallel with the switching elements (e.g., diodes) to filter electric signals having certain frequency characteristics, which in at least some cases are selectable. An output of the third rectifier 130 charges the one or more storage circuits 136 (e.g., capacitors) during charging phases of the circuit 100. The output of the third rectifier 130 is also provided to the one or more second EMI filters 132 and the error correction portion 134.

The one or more second EMI filters 134 may include one or more pairs of inductive elements connected in parallel with each other, the one or more second EMI filters 134 and may further include one or more storage elements (e.g., capacitors) connected with the inductive elements. The second EMI filter(s) 132 provides filtered DC power at power output 104 and provides the digitally stable ground 106. During charging phases of the circuit 100, the third rectifier 130 provides current to the second EMI filter 132. During non-charging phases of the circuit 100, when the third rectifier 130 is not charging the storage element 136, the storage element 136 is arranged to provide current to the second EMI filter 132.

The error correction portion 134 provides, based on the output from the third rectifier 130 and/or the storage element 136, an error correction signal to the second isolator 128. The second isolator 128 may provide galvanically isolated feedback to the PWM controller 120 based on the error correction signal. In some embodiments, the second isolator 128 includes an optical isolator (e.g., optocoupler) having a first electrical component that transmits an optical signal from the second side 110 across a dielectric barrier to a second electrical component of the optical isolator located on the first side 108, thereby providing the galvanically isolated feedback. The PWM controller 120 may operate the solid-state switch 122 based at least in part on the galvanically isolated feedback received from the second isolator 128.

Figure 2A:
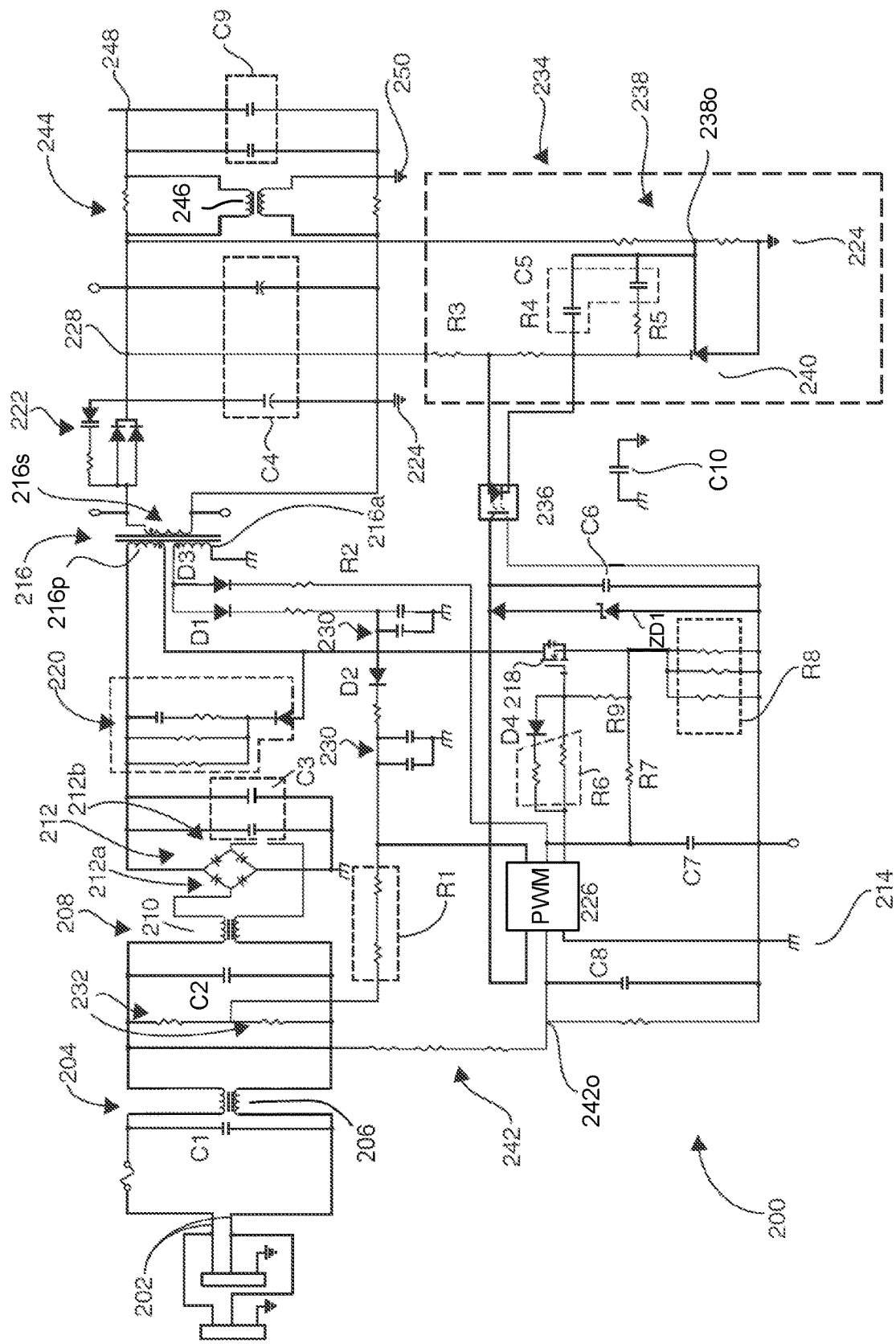
FIG. 2A is a schematic diagram of a power conversion portion of the circuit of FIG. 1.

FIG. 2A is a schematic diagram of a circuit 200 for converting AC power into DC power and for providing a digitally stable ground according to one or more embodiments. The circuit 200 is an example of the circuit 100 described above. The circuit 200 has a first pair of inputs 202 for receiving AC power input. The AC power input is provided to a first EMI filter 204 comprising a set of inductive and capacitive elements. The first EMI filter 204 includes a first pair of inductive elements 206 connected in parallel with each other and a capacitor C1 connected between first terminals of the first pair of inductive elements 206. The first pair of inductive elements 206 may be a common mode choke having coils wound around a common core. The circuit may include a second EMI filter 208 comprising a second pair of inductive elements 210 and a second capacitor C2 arranged in a topology similar to the topology of the first EMI filter 204. The second pair of inductive elements 210 may be a common mode choke having coils wound around a common core. Output terminals of the first EMI filter 204 may be connected to input terminals of the second EMI filter 208. The first EMI filter 204 may filter electric signals having first frequency characteristics whereas the second EMI filter 210 may filter electric signals having second frequency characteristics different than the first frequency characteristics. That is, the second EMI filter 210 may have a different frequency response than the first EMI filter 204. The first EMI filter 204 and the second EMI filter 210 may collectively comprise the one or more EMI filters 116 described with respect to FIG. 1. In some embodiments, a voltage divider network 232 may be connected between the output terminals of the first EMI filter 204. The voltage divider network 232 may include any number of taps, and the taps may be selectable. The voltage divider network 232 is arranged, in at least some cases, to discharge electric charge stored in components of the circuit 200. In the embodiment of FIG. 2A, the voltage divider network 232 includes a pair of resistors having any suitable value.

A diode bridge 212 comprising a set of diodes is connected to an output of the second EMI filter 210. The diode bridge 212 includes a first pair of diodes 212a connected in series wherein an anode of one diode of the first pair of diodes 212a is connected to a cathode of the other diode of the first pair of diodes 212a to define a first input to the diode bridge 212. The diode bridge 212 also includes a second pair of diodes 212b connected in series wherein an anode of one diode of the second pair of diodes 212b is connected to a cathode of the other diode of the second pair of diodes 212*b* to define a second input of the diode bridge 212. The first pair of diodes 212*a* are connected in parallel with the second pair of diodes 212*b* with a cathode of the first pair of diodes 212*a* being connected to a cathode of the second pair of diodes 212*b* and an anode of the first pair of diodes 212*a* is connected to an anode of the second pair of diodes 212*b*. The commonly connected anodes of the first and second pair of diodes 212*a* and 212*b* are connected to a first ground node 214 corresponding to the first ground 112 described above with respect to FIG. 1.

A set of capacitors C3 are connected in parallel with output terminals of the diode bridge 212 to smooth or dampen fluctuations in the output of the diode bridge 212. A transformer 216 is provided to galvanically isolate an input side of the circuit 200 from an output side of the circuit 200. The transformer 216 corresponds to at least a portion of the first isolator 126 of FIG. 1. A first terminal of a primary winding 216*p* of the transformer 216 is connected to the diode bridge 212 and the set of capacitors C3 to receive the output therefrom. A second terminal of the primary winding 216*p* is connected to a first terminal of a solid-state switch 218. A second terminal of the solid-state switch 218 is connected the first ground node 214. The connection of the second terminal of the solid-state switch 218 to the first ground node 214 may be a direct connection in some cases, or an indirect connection in some other cases. For example, as depicted in FIG. 2A, the second terminal of the solid-state switch 218 is connected to the first ground node 214 via an optional resistor network R8.

The solid-state switch 218 is operable to selectively permit and/or inhibit current flow through the primary winding 216*p* of the transformer 216. A snubber sub-circuit 220 is connected in parallel with the primary winding 216*p* to clamp the output of the primary winding 216*p* during switching events of the solid-state switching device 218. The snubber sub-circuit 220 in the embodiment of FIG. 2A comprises a diode having an anode connected to the second terminal of the primary winding 216*p* and having a cathode connected to a resistor-capacitor network. The resistor-capacitor network may be arranged in any suitable configuration. In the embodiment of FIG. 2A, the network is formed to include one or more resistors connected in parallel with a series-connected capacitor and resistor.

The secondary winding 216*s* has a first terminal connected to a switch (e.g., rectifier 222) and a second terminal connected to a second ground node 224. The rectifier 222 includes a diode having an anode side connected to the first terminal of the secondary winding 216*s* and a cathode side connected to one or more capacitors C4. The rectifier 222 may include a set of resistors and capacitors connected in parallel with the rectifier 222. The rectifier 222 permits uni-directional flow of current on the secondary winding 216*s* side of the transformer 216. A rectified output 228 is provided at a cathode side of the rectifier 222.

A PWM controller 226 controls a switching state of the solid-state switch 218 based on a set of conditions in the circuit 200. The PWM controller 226 of the circuit 200 may be a current mode PWM controller, such as the ON-BRIGHT OB2268; however, the circuit 200 may be realized using other PWM controllers without departing from the scope of the present disclosure. The PWM controller 226 has a gate output driver connected to a gate terminal of the solid-state switch 218 to control a switching state of the solid-state switch 218. The PWM controller 226 causes the solid-state switch 218 to selectably transition between a conduction or ON state and a non-conduction or OFF state. The conduction state is one in which the solid-state switch 218 permits current to flow there through such that current flows through the primary winding 216*p*, through the solid-state switch 218, and to the first ground node 214. The non-conduction state is one in which the solid-state switch 218 prevents or inhibits current from flowing through the solid-state switch 218 to the first ground node 214. The solid-state switch 218 of the circuit 200 is, in at least some cases, an N-channel enhancement mode power MOSFET, but other types of solid-state switches may be used depending on the application.

The auxiliary winding 216*a* is connected to a power supply terminal of the PWM controller 226 for powering the PWM controller 226. The auxiliary winding 216*a* of the transformer 216 has a first terminal connected to one or more switch circuits (e.g., diodes) and a second terminal connected to the first ground node 214. An anode side of one or more first diodes D1 are connected the first terminal of the auxiliary winding 216*a* to rectify power from the auxiliary winding 216*a*. One or more low-pass filters (LPF) 230 are provided between the first diode D1 to smooth the voltage powering the PWM controller 226. A second diode D2 may be provided between successive LPFs 230. The power supply terminal of the PWM controller 226 may be connected to one or more first resistors R1 connected to a node between the voltage divider network 232 connected between output terminals of the first EMI filter 204. Excess power, such as electric charge stored in the one or more LPFs 230, may be fed back into the EMI filter(s) and symmetrically dissipated in the first pair of resistors 232.

The auxiliary winding 216*a* is also connected to an anode of a third diode D3. A cathode of the third diode D3 is connected to a current sense input of the PWM controller 226. The PWM controller 226 controls switching of the solid-state switch 218 based at least in part on a current level received at the current sense input CS. A second resistor R2 is connected between the auxiliary winding 216*a* and the current sense input CS to set the current level.

The circuit 200 in the embodiment of FIG. 2A operates as an AC/DC flyback converter, however other circuits and modes of operation are also contemplated. During conduction mode periods when the solid-state switch 218 is in a conducting state, the rectifier 222 and diodes D1 and D3 prevent current from flowing and energy is stored in the core of the transformer 216. During these conduction modes, the capacitors C4 and LPFs 230 discharge stored energy. During non-conduction mode periods when the solid-state switch 218 is in a non-conducting state, energy stored in the transformer 216 is delivered to the LPFs 230, the capacitor(s) C4, and to a load connected to the circuit 200, as discussed herein. There is, in at least some optional cases, a discontinuous conduction mode in which, after the transformer 216 is depleted of energy, the capacitor(s) C4 continue to output energy.

The rectified output 228 is provided to an error compensation portion 234 that causes an adjustment in the PWM controller 226 as a result of detecting error in the rectified output 228. In particular, the error compensation portion 234 is connected to a semiconductor transmitter of an optical isolator 236. The error compensation portion 234 causes the semiconductor transmitter to communicate an optical signal across a dielectric barrier to a semiconductor receiver of the optical isolator 236, thereby providing galvanically isolated feedback to the PWM controller 226. The error compensation portion 234 includes a first voltage divider 238 having two or more resistors arranged in series between the rectified output 228 and the second ground node 224, and having an output provided between adjacent resistors of the two or more resistors.

The error compensation portion 234 also includes a shunt regulator 240 that regulates voltage across the semiconductor transmitter of the optical isolator 236. Examples of the shunt regulator 240 may include the LM431 produced by TEXAS INSTRUMENTS and the AP431AN produced by ADVANCED POWER ELECTRONICS. An output 238o of the first voltage divider 238 is connected to a reference input of the shunt regulator 240. The error correction portion 234 has a resistor R3 and a resistor R4 connected in series between the rectified output 228 and a cathode node of the shunt regulator 240. The resistors R3 and R4 help to establish a minimum current for regulation through the shunt regulator 240. One or more capacitors C5 and one or more resistors R5 may be connected between the cathode node and the reference input of the shunt regulator 240 that provide compensation controlling loop bandwidth and/or frequency response of the circuit 200.

As a result of the error compensation portion 234 detecting a condition in the rectified output 222 indicative of operational error (e.g., voltage exceeding a predetermined voltage range), the error compensation portion 234 causes activation of the semiconductor transmitter of the optical isolator 236. Activation of the semiconductor transmitter causes the semiconductor receiver of the optical isolator to transition from a first state to a second state. For example, when the communication of a signal from the transmitter of the optical isolator 236 causes the semiconductor receiver to transition from a non-conducting state to a conducting state. The semiconductor receiver of the optical isolator 236 has a terminal coupled to a feedback input or voltage sense input of the PWM controller 226. The PWM controller 226 may control switching of the solid-state switch 218 based at least in part on the voltage input received at the feedback input. A Zener diode ZD1 and/or a capacitor C6 may be connected between the feedback input and the first ground node 214 to help suppress or protect against transient voltage surges.

One or more resistors R6 and a diode D4 connected in parallel with at least one of the set of resistors R6 may be connected between the gate output driver and the gate terminal of the solid-state switch 218 to improve the turn-off response of the solid-state switch 218. An additional resistor may be included in series with the diode D4 to adjust the turn-on response of the solid-state switch 218.

A network of elements may be connected to the current sense input of the PWM controller 226 for providing a pulse filter for additional protection against a sudden voltage spike. For instance, a capacitor C7 may be connected between the current sense input and the first ground node 214 and a resistor R7 may be connected between the current sense input and the source terminal of the solid-state switch 218. Other resistive elements may be connected to terminals of the solid-state switch 218. For example, a resistor R8 may be connected between the source terminal of the solid-state switch 218 and the first ground node 214. A resistor R9 may be connected between the gate terminal and the source terminal of the solid-state switch 218.

A second voltage divider 242 comprised of two or more resistors in some embodiments is connected in series between an output terminal of the first EMI filter 204 and the first ground node 214. An output 242o of the second voltage divider 242 is connected to a protection input of the PWM controller 226. The PWM controller 226 may operate in an overvoltage protection mode as a result of detecting a voltage exceeding a predetermined threshold at the protection input. The overvoltage protection mode may cause the PWM controller 226 to shut down to protect itself and associated components in the event of an over voltage condition. A capacitor C8 may be connected between the protection input PRT and the first ground node 214.

A third EMI filter 244 may be provided having a first input terminal connected to the rectified output 228 and a second terminal connected to the second ground node 224. The third EMI filter may include one or more pairs of inductive elements 246 connected in parallel with each other, and may include one or more capacitors C9 connected between terminals of the inductive elements 246. The third EMI filter 244 may filter electric signals having certain frequency characteristics to provide a DC output 248 relative to a digitally stable output ground 250. A capacitor C10 may be connected between the first ground node 214 and the second ground node 224.

In at least some embodiments, circuit 200 may be part of a processor-based device that is selectively connectable to a photo-controller receptacle of a light pole, such as those located along public streets. Light poles of this type have a receptacle for attachment of a photo-controller that controls illumination and dimming of lighting elements of the light pole based on ambient light detected. The processor-based device, of which the circuit 200 is a part, connects to the light pole receptacle and provides additional features and functionality that are unavailable in standard photo-controllers. In at least some embodiments, the processor-based device provides wireless cellular-based network communication services around the light pole. The processor-based device is powered by AC mains power received through the receptacle at the first pair of inputs 202. The circuit 200 converts the AC mains power into DC power that is useable by the processor-based device, and the circuit 200 provides a digitally stable ground that is galvanically isolated from the mains power ground.

Figure 2B:
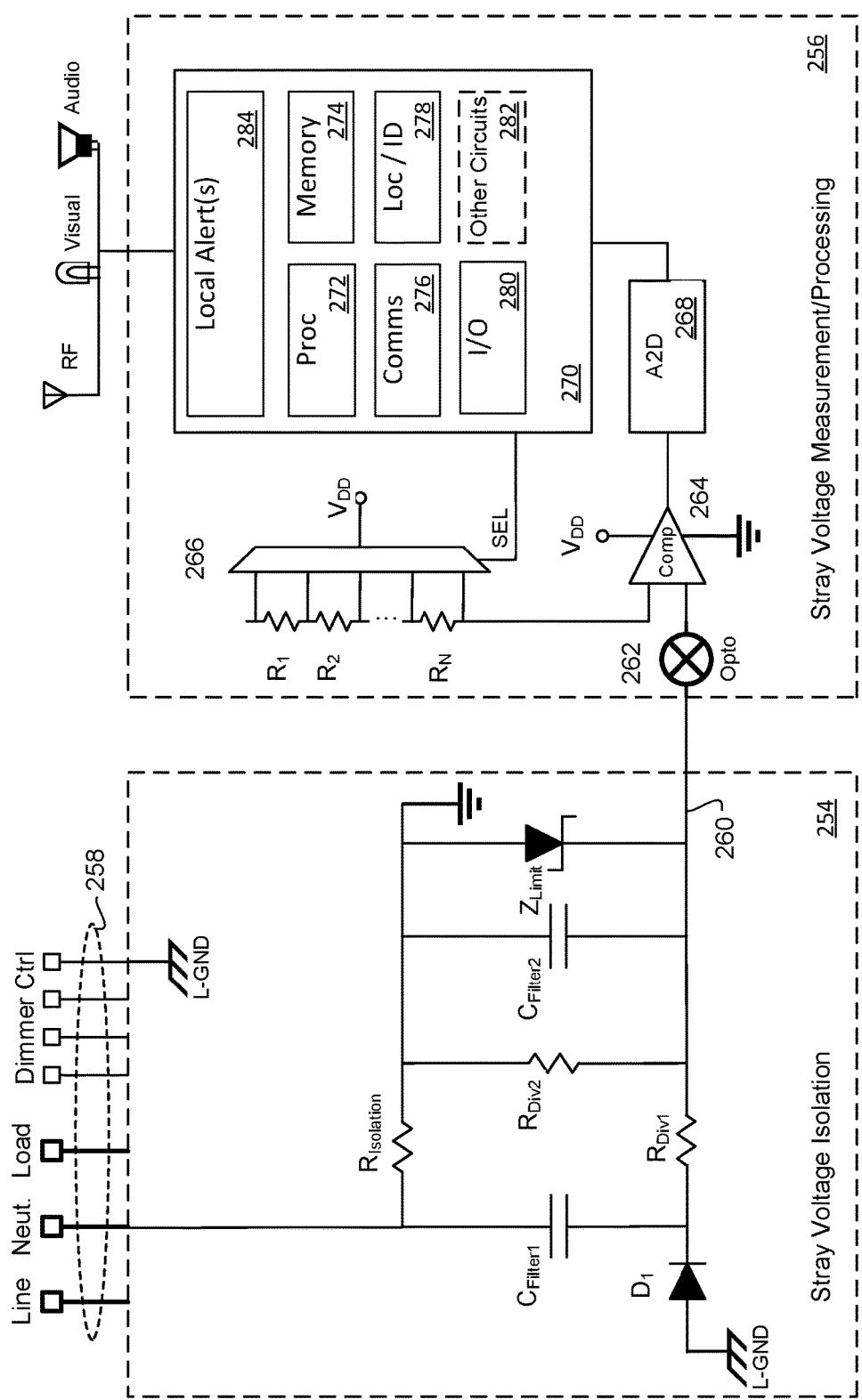
FIG. 2B is a schematic diagram of a stray voltage detection and processing circuit.

FIG. 2B is a schematic diagram of a stray voltage detection and processing module 252. The module 252 of FIG. 2B is along the lines of the stray voltage detector 115 portion of the circuit 100 of FIG. 1 for converting alternating current (AC) power input 102 into direct current (DC) power output 104. The stray voltage detection module 252 of FIG. 2B includes two portions. A first portion is a stray voltage isolation circuit 254, and a second portion is a stray voltage measurements/processing circuit 256.

The stray voltage isolation circuit 254 includes a powerline interface 258, which in at least some cases is a standardized interface. In the embodiment of FIG. 2B, the standardized powerline interface 258 is arranged to pass power transmission signals, which include a line power signal, a neutral power signal and a load power signal.

The standardized powerline interface 258 may also be arranged with a plurality of optional dimmer control signals. Four dimmer control signals are represented in the standardized powerline interface 258 of FIG. 2B. In some exemplary cases, four dimmer control signals permit two independent dimmer control channels. In other cases, a single dimmer control signal is a reference plane (e.g., ground), and three separate dimmer channels are implemented. In yet other cases, the plurality of dimmer control lines communicate encoded binary data, and in still other cases, the plurality of dimmer control lines implement a particular protocol (e.g., USB, I2C, SPI, or the like).

Figure 3:
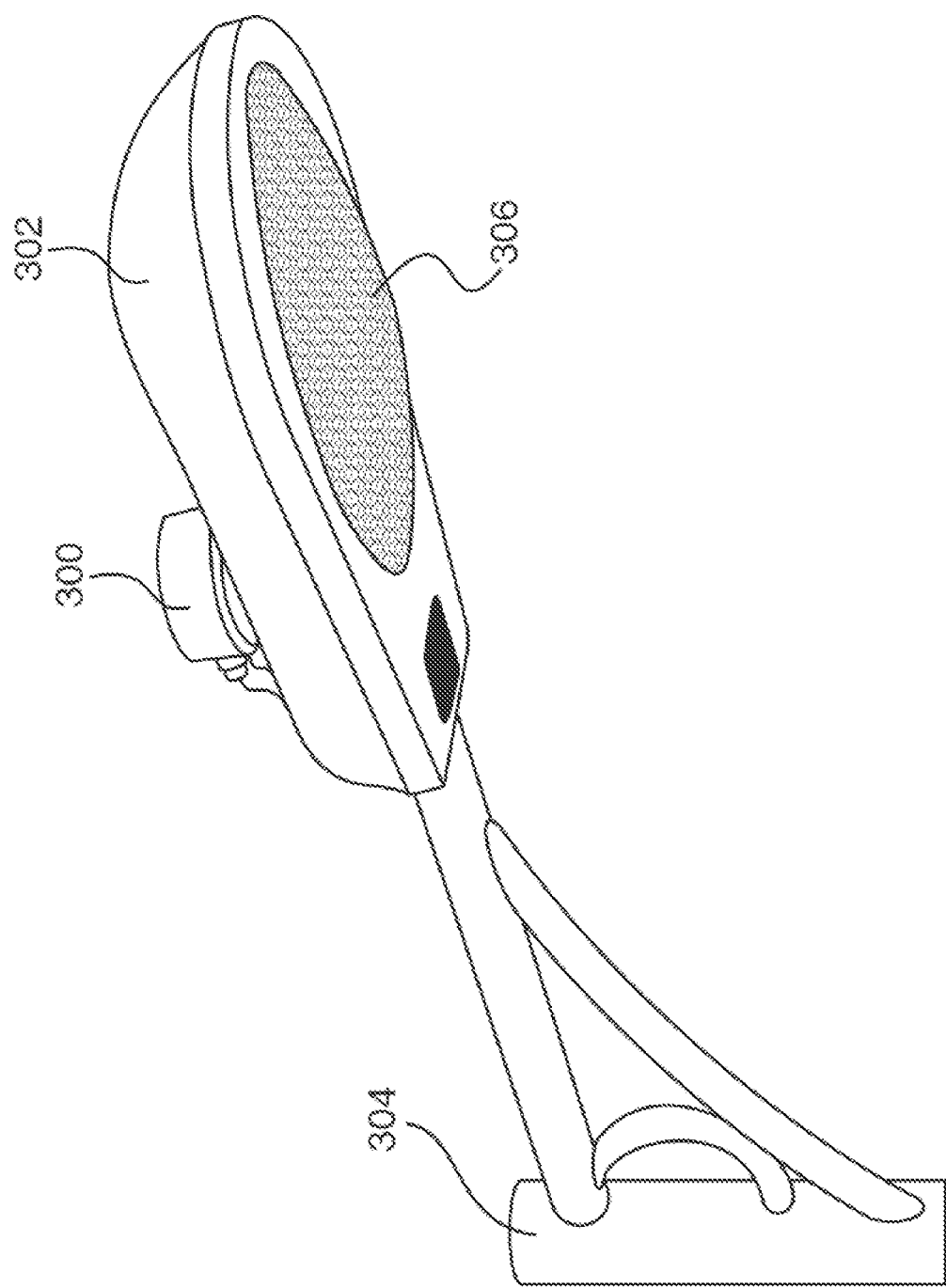
FIG. 3 is a processor-based device including the circuit of FIG. 1, the processor-based device being mounted on a light fixture.

In many cases, the standardized powerline interface 258 is arranged for use in a luminaire such as the streetlight of FIG. 3. Accordingly, the standardized powerline interface 258 may in some cases be known as a NEMA interface, a NEMA socket, and NEMA connector, or the like as discussed herein.

In the embodiment of FIG. 2B, at least one dimmer control signal is electrically coupled to a a chassis ground (e.g., lamp ground, L-GND). In this way, a physical ground signal that is electrically coupled to a housing of a certain device where the stray voltage detection module 252 is operating is electrically available to the electronic circuits of the certain device.

When the circuitry of FIG. 2B is operating, the stray voltage isolation circuit 254 is arranged to isolate a stray voltage signal 260, which is a voltage potential realized between the neutral line of the standard power transmission signals, and the chassis ground L-GND of the certain device. It is recognized that such a potential may be caused by improper grounding, mis-wiring of equipment, equipment failure, failure in insulation around a hot power line conduit, capacitive coupling between energized lines and non-energized lines (e.g., un-connected adjacent wiring), an accident (e.g., a car accident that strikes a power pole and causes an energized powerline too short to the neutral line) or by some other circumstance.

In FIG. 2B, the neutral powerline transmission signal is coupled to a voltage divider network formed with a plurality of resistors, $R_{DIV1}$, $R_{DIV2}$. The neutral powerline transmission signal may be further coupled to one or more optional filtering capacitors $C_{Filter1}$, $C_{Filter2}$. A tap in the voltage divider provides a source voltage at the anode of a Zener diode $Z_{Limit}$, which, if such diode is included, is arranged as a protection device to limit the voltage of the stray voltage signal 260. The current path through the voltage divider and optional Zener diode $Z_{Limit}$ terminates at a ground plane (e.g., digitally stable ground 250 of FIG. 2A). Correspondingly, a chassis line signal (e.g., L-GND) is half-wave rectified by a diode, and current limited by a resistor $R_{Isolation}$. The chassis line signal is coupled to the cathode of the Zener $Z_{Limit}$ diode, and continues on as the voltage-limited stray voltage signal 260. Other circuits for forming the stray voltage signal 260 are contemplated.

The stray voltage signal 260 is passed as an input to the stray voltage measurements/processing circuit 256. The stray voltage measurements/processing circuit 256 may optionally include an optical coupling circuit 262, a comparator circuit 264, a reference voltage selection circuit 266, an analog to digital converter (A2D) 268, and a microcontroller. The microcontroller 270 may optionally include a processor 272, memory 274, a communications module 276, a location/identification module 278 (e.g., global positioning system (GPS), MAC ID, IMEI module, or some other unique location or identification structure), an input/output (I/O) module 280, and certain other circuits 282. Additionally, the stray voltage measurements/processing circuit 256 may include a local alert processing module 284. It is recognized that in at least some cases, any one or more of the optical coupling circuit 262, comparator circuit 264, reference voltage selection circuit 266, and A2D 268 may be included as part of the certain other circuits 282 within the microcontroller 270.

In operation, particularly when the stray voltage input signal to the stray voltage measurements/processing circuit 256 may be unregulated, or otherwise unpredictable at least some of the time (e.g., lightning strike, maximum transmission line voltage, or the like), the optical coupling circuit 262 may be used to protect the circuitry of the stray voltage measurement/processing circuit 256.

In the embodiment of FIG. 2B, the processor 272 is arranged to execute software instructions stored in the memory 274. The execution of such instructions may include retrieving particular data stored in the memory 274, and in at least some cases the cooperation between the executing software instructions and the data stored in the memory causes the I/O module 280 to assert a selection signal on the reference voltage selection circuit 266. In at least some cases, the selection signal is applied to a multiplexor, and the selected output of the multiplexor determines a reference voltage that will be applied to the comparator 264. In this way, the stray voltage signal 260 is compared against the reference voltage from the reference voltage selection circuit 266.

In at least some cases, the comparator 264 is a circuit formed using an operational amplifier and other known circuitry (not shown), and the output signal from the comparator 264 is an analog voltage signal that represents the difference between the reference voltage and the isolated stray voltage signal. In other cases, comparator 264 is formed as a comparator, and the output signal is a binary value indicating that the input stray voltage signal 260 has or has not exceeded the signal level of the reference voltage selection circuit 266. In either case, the output signal of the comparator 264 is converted by the A2D 268 to a digital value, which may directly represent the level of stray voltage potential or which may be used to calculate the level of stray voltage. Accordingly, software executing in the microcontroller 270 may be used to determine a discrete stray voltage level (e.g., 3 volts, 10 volts, 50 volts, 280 volts, or some other level), or software may be used to determine a relative voltage level (e.g., "safe," "moderate," "dangerous," "extremely dangerous," or the like).

In at least some cases, such as when the comparator is arranged as an operational amplifier that generates an analog value from the stray voltage signal 260, the digital value output of the A2D 268 is a saturation value, which may indicate a very high stray voltage input. In these cases, the software instructions executed by the processor 272 may provide a different selection value to the reference voltage selection circuit 266, which can then provide a different reference voltage at the comparator 264. In at least some cases, the process of identifying a proper reference voltage, and thereby determining a useful digital output from the A2D 268 is an iterative process.

In some cases, further software instructions stored in the memory 274 are arranged to analyze the determined stray voltage value. The analysis may include determining whether the stray voltage is a new condition, an evolving condition, a known existing condition, or some other condition. The analysis may alternatively, or additionally, include determining whether the stray voltage is safe, moderately safe, moderately unsafe, dangerous, extremely dangerous, or some other determination. Accordingly, based on the analysis, still further software instructions stored in the memory 274 and executed by the processor 272 may cause a local output at the device, a communication of the determined stray voltage condition, or some other action.

When the stray voltage measurements/processing circuit 256 determines, for example, a dangerous stray voltage condition, the local alert processing module 284 may be used to assert an audible signal in proximity to the device (e.g., via a speaker, a piezo device, a buzzer, a siren, or the like), a visual signal in proximity to the device (e.g., a solid light, a flashing lich, an indication on a display, or the like), or a short-range wireless signal (e.g., WiFi, BLUETOOTH, or the like). The wireless signal may, for example, be received by all computing devices communicatively coupled (e.g., WiFi) to the device. In at least one case, for example, the device may be arranged as a public WiFi "hotspot," and all mobile computing devices that are communicatively coupled to the particular hotspot will receive the alert generated by the local alert processing module 284. In still other cases, the communication module 276 may be arranged to communicate information representing the stray voltage condition to a remote computing device via a wired connection (e.g., Ethernet, fiber, powerline communications, or the like), a wireless connection (e.g., a cellular-based (e.g., 4G, LTE, 5G, or the like) communication medium), or both a wired and a wireless connection.

FIG. 3 is a processor-based device 300 mounted to light fixture 302, which itself is mounted to a light pole 304. The light fixture 302 includes a light source 306 comprising one or more lighting elements for illuminating a street, public area, or any other desirable location. The light source 306 may be an incandescent light source, a light emitting diode (LED) light source, a high pressure sodium lamp, or any other type of light source. In the street light of FIG. 3, the processor-based device 300 is coupled to the light fixture 302 via a receptacle having a predetermined configuration established according to one or more standards. Certain standards provided by the National Electrical Manufacturers Association (NEMA) are directed to standards for Roadway and Area Lighting Equipment, such as ANSI C136 standards. More particularly, some NEMA standards are directed to external locking type photo-control devices for street and area lighting, such as ANSI C136.41. The receptacle of the light fixture 302 has a set of receptacle elements for engaging with a connector satisfying one or more ANSI standards to electrically and mechanically couple a photo-controller thereto.

FIG. 4A is a perspective view of a processor-based device 400. FIG. 4B is a right side view of the processor-based device 400 of FIG. 4A. The processor-based device 400 has a cylindrically-shaped body 401 housing a processor and the circuitry 200 described herein. In other embodiments, the body of the processor-based device may have any suitable shape, size, and other characteristics. The processor-based device 400 includes a connector 402 for selectively mounting the device 400 to the NEMA receptacle of the light fixture 302. The processor-based device of FIGS. 4A, 4B may include an integrated multi-pin NEMA receptacle 404 on an upper portion thereof. Though not expressly marked, the multi-pin NEMA receptacle 404 embodiment of FIG. 4A includes three holes, which are arranged to electromechanically receive three pins of a compatible NEMA connector. For instance, the receptacle 404 may be identical to a NEMA receptacle provided on the light fixture 302. The receptacle 404 has contact elements that electrically couple with connector elements of a photo-controller having a NEMA configured connector. The connector 402 has a set of connector elements, such as pins or prongs, satisfying one or more ANSI standards, such as the ANSI C136 standard.

A photo-controller may be selectively mounted or attached to the processor-based device 400 for controlling illumination and dimming of the lighting elements of the light source 306.

Figure 5:
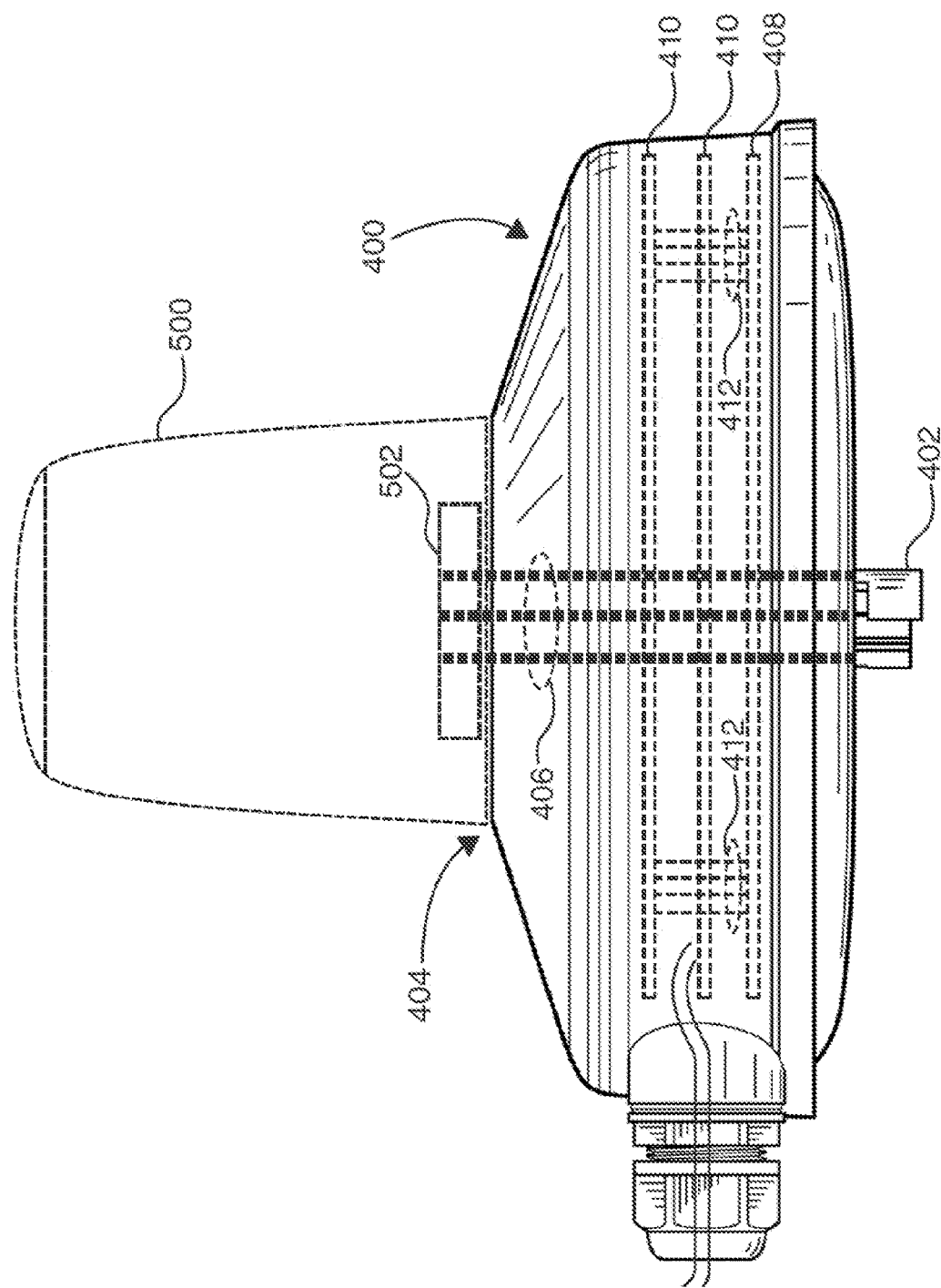
FIG. 5 is a side view of the processor-based device having a photo-control device coupled to a receptacle of the processor-based device.

FIG. 5 is an embodiment of a photo-control device 500 having a photo-controller 502 electrically coupled to connector elements of the connector 402 through the NEMA receptacle 404 (See FIG. 404). A set of electrical conduits 406 connect electrical contacts of the receptacle 404 with electrical contacts of the connector 402 for transmission of electrical power between mains power to the photo-controller 502 and for transmission of electrical control signals from the photo-controller 502 to the lighting elements of the light source 306 as a result of the photo-controller 502 detecting certain ambient lighting conditions.

A first printed-circuit board (PCB) 408 or other electrical substrate is embodied within a housing of the processor-based device 400. The first PCB 408 includes the circuit 200 described herein. The PCB 408 has electrical contacts electrically coupled to connector elements of the connector 402 to receive AC mains power when the processor-based device 400 is mounted to the light fixture 302. The processor-based device 400 includes one or more additional PCBs 410 having processors and electrical components disposed thereon that operate as independent devices, such as a small cell networking device enabled to provide services for the streetlight and services for mobile devices in proximity to this or other streetlights. In at least some cases, the small cell device is also arranged to provide still other additional services to one or more third party entities such as utilities, law enforcement, schools, and retail and wholesale businesses. The small cell device is described, for example, in U.S. Patent Application No. 62/614,918, filed Jan. 8, 2018, which is incorporated herein by reference in its entirety and International Patent Application PCT/US2019/012775, filed Jan. 8, 2019, which is incorporated by reference in its entirety.

The PCBs 410 may have peripheral devices and/or sensors coupled thereto for performing various operations. For instance, one or more PCBs 410 may include a wireless transceiver module providing wireless communication capability to any one or more devices having corresponding wireless transceivers. In some cases, for example, using functionality provided by the wireless transceiver module, the wireless transceiver module operates as a WiFi access point. In this way, the processor-based device 400 permits one or more mobile devices to access the internet. Municipalities or other entities may make internet services available over a determined geographic area (e.g., a neighborhood, a city, an arena, a construction site, a campus, or the like) to remote mobile devices that are in proximity to any one of a plurality of processor-based devices 200. For example, if many street light fixtures in a neighborhood or city are equipped with a small cell networking device, then WiFi service can be provided to a large number of users. What's more, based on seamless communication between a plurality of small cell networking devices, the WiFi service can be configured as a mesh that permits users to perceive constant internet connectivity even when the mobile device is in motion. These and other devices described in U.S. Patent Application No. 62/614,918 may be included in, associated with, or coupled to the PCBs 410. In some embodiments, the processor-based device 400 may not have the receptacle 404 and may instead include a photo-controller and associated photo-sensor for controlling illumination and dimming of the light source 306.

The circuit 200 on the PCB 408 converts the AC mains power into DC power that powers the devices of PCB 408 and devices of the PCBs 410. The circuitry 200 provides DC power output 248 and the digitally stable ground 250 to the PCBs 408, 410 and/or associated devices via one or more coupling structures 412, such as electrically conductive cables or wires, comprising a power bus. The coupling structures may include wires or other types of electrical conduits. The coupling structures may also include pins, receptacles, housings, standoffs, bushings, contacts, and other suitable electrical, mechanical, or electromechanical structures. The DC power output 248 may have a DC voltage with a level and stability that safely powers digital circuits and/or processors (e.g., 1.8 VDC, 3.3 VDC, 5 VDC, 10 VDC, 12 VDC). The AC mains power level, which the circuitry 200 converts into the DC power output 248, may be 60 VAC, 120 VAC, 230 VAC, 240 VAC, 400 VAC, or some other AC voltage, and the AC mains power may have a frequency of 60 Hertz or 50 Hertz, by way of non-limiting example. In some embodiments, other signals are also passed through the multi-pin NEMA receiver 404 and the multi-pin NEMA connector 402. The multi-pin NEMA devices may include one or more contacts to pass these other signals, which may include a plurality of low power direct current (e.g., 0 VDC to 10 VDC) dimming control signals or other control signals.

Figure 6:
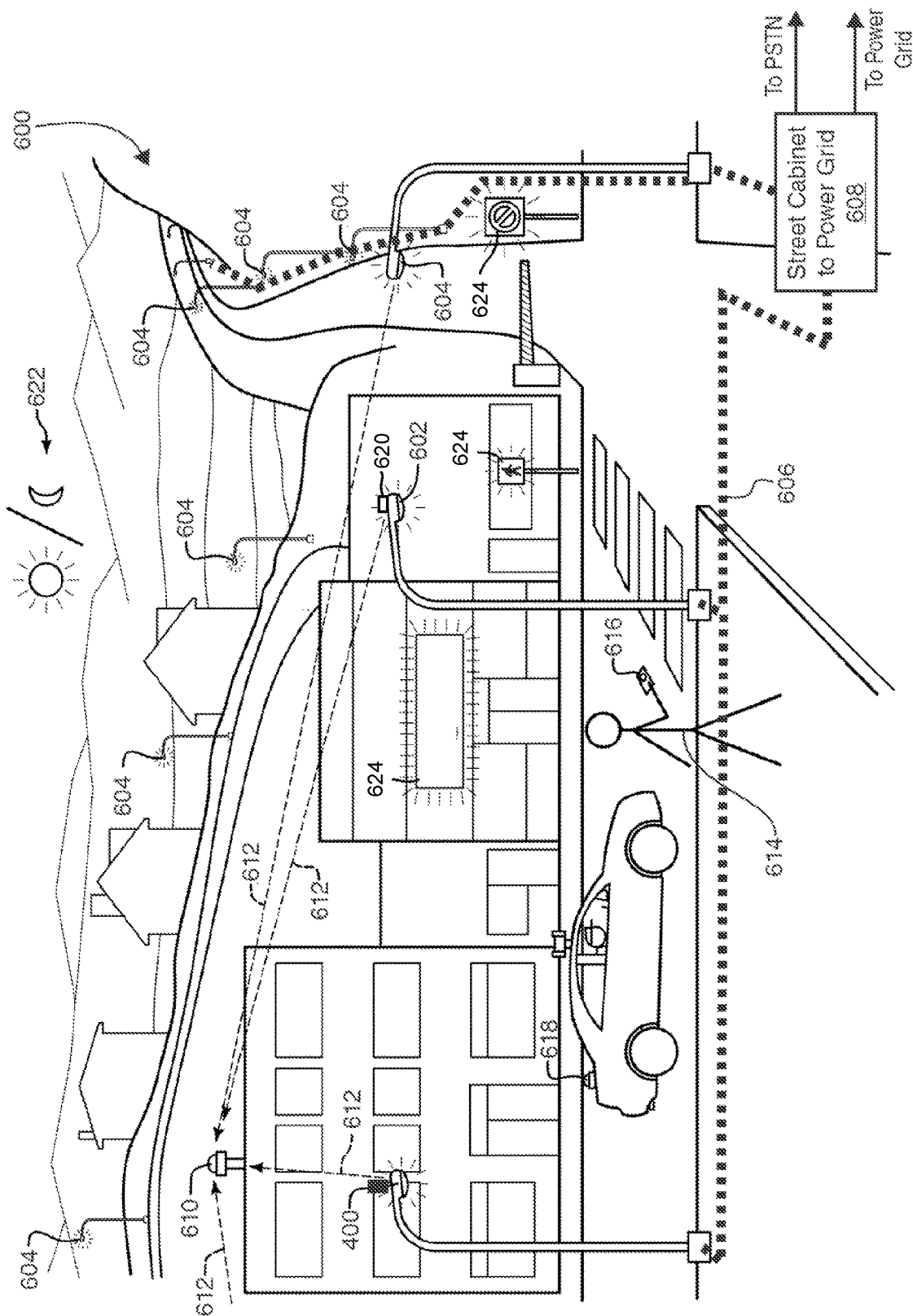
FIG. 6 is a system level deployment having at least one small cell networking device and a plurality of smart sensor devices coupled to streetlight fixtures.

FIG. 6 is a system level deployment 600 having at least one processor-based device 400 (e.g., small cell networking device) and a plurality of smart sensor devices 620 coupled to streetlight fixtures 604. The streetlight fixtures 604 are coupled to or otherwise arranged as part of a system of streetlight poles, each streetlight fixture 604 includes a light source 602. Each light source, light fixture, and light fitting, individually or along with their related components, may in some cases be interchangeably referred to as a luminaire, a light source, a streetlight, a streetlamp, or some other such suitable term. To avoid unnecessarily crowding FIG. 6, individual smart sensor devices 620 are not identified on streetlight fixtures 604, however it is recognized that such smart sensor devices 620, or such processor-based devices 400, may be coupled to any number of street light fixtures 604 (e.g., all street light fixtures 604, every other street light fixture, every Nth streetlight fixture, or some other number of streetlight fixtures).

As shown in the system level deployment 600, a plurality of light poles are arranged in one or more determined geographic areas, and each light pole has at least one light source 602 positioned in a streetlight fixture 604. The fixture is at least twenty feet above ground level and in at least some cases, the fixtures are between about 20 feet and 40 feet above ground level. In other cases, the streetlight fixtures may of course be lower than 20 feet above the ground or higher than 40 feet above the ground.

The system of streetlight poles, streetlight fixtures, streetlight sources, or the like in the system level deployment may be controlled by a municipality or other government agency. In other cases, the system of streetlight poles, streetlight fixtures, streetlight sources, or the like in the system level deployment is controlled by a private entity (e.g., private property owner, third-party service contractor, or the like). In still other cases, a plurality of entities share control of the system of streetlight poles, streetlight fixtures, streetlight sources, or the like. The shared control may be hierarchical or cooperative in some other fashion. For example, when the system is controlled by a municipality or a department of transportation, an emergency services agency (e.g., law enforcement, medical services, fire services) may be able to request or otherwise take control of the system. In still other cases, one or more sub-parts of the system of streetlight poles, streetlight fixtures, streetlight sources, or the like can be granted some control such as in a neighborhood, around a hospital or fire department, in a construction area, or in some other manner.

In the system level deployment 600 of FIG. 6, any number of streetlight fixtures 604 may be arranged with a connector that is compliant with a roadway area lighting standard promoted by a standards body. The connector permits the controlling or servicing authority of the system to competitively and efficiently purchase and install light sensors on each streetlight fixture. In addition, or in the alternative, the standardized connector in each streetlight fixture permits the controlling or servicing authority to replace conventional light sensors with other devices such as a small cell networking device, a smart sensor device 620, or some other device.

Figure 4:
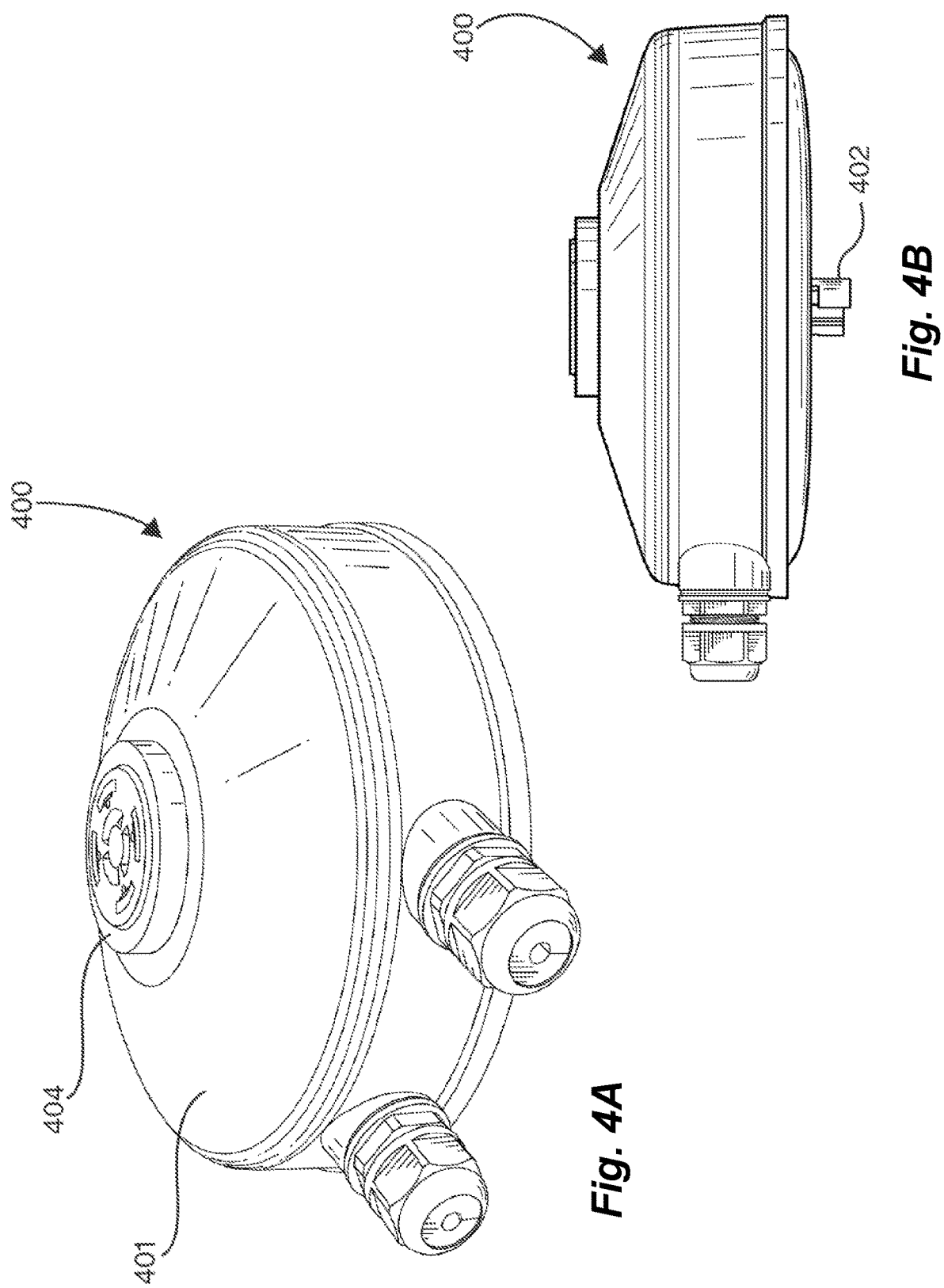
FIG. 4A is a perspective view of the processor-based device of FIG. 3.
FIG. 4B is a right side view of the processor-based device of FIG. 4A.

In the system level deployment 600, a small cell networking device is electromechanically coupled to a selected light pole wherein the electromechanical coupling is performed via the connector that is compliant with the roadway area lighting standard promoted by a standards body (e.g., connector 402 and/or receptacle 404 of FIG. 4). Stated differently, the system level deployment 600 includes at least one light pole and fixture with a small cell networking device, and a plurality of light poles each having a smart sensor device(s) 620. In these light poles of the system level deployment 600, each streetlight fixture 604 is equipped with a standalone smart device such as the smart sensor device 620 that is electromechanically coupled via a respective connector that is compliant with the roadway area lighting standard promoted by the standards body. In this arrangement, each streetlight 602, 604 is equipped with a light sensor that is further electrically coupled to a processor-based light control circuit. In other deployments, less than all streetlight fixtures 604 will be equipped with the smart sensor devices 620 or small cell networking devices described herein.

The processor-based light control circuit of each smart device is arranged to provide a light control signal to the respective light source based on at least one ambient light signal generated by its associated the light sensor. In addition, because each streetlight 602, 604 is equipped with communication capabilities, each light source in each streetlight 602, 604 can be controlled remotely as an independent light source or in combination with other light sources. In these cases, each of the plurality of light poles and fixtures with a smart sensor device 620 is communicatively coupled to the light pole and fixture with a small cell networking device (i.e., a processor-based device 400). The communicative relationship from each of the plurality of light poles and fixtures with a smart sensor device 620 to the light pole and fixture with a small cell networking device may be a direct communication or an indirect communication. That is, in some cases, one of the plurality of light poles and fixtures with a smart sensor device 620 may communicate directly to the light pole and fixture with a small cell networking device or the one of the plurality of light poles and fixtures with a smart sensor device 620 may communicate via one or more other ones of the plurality of light poles and fixtures with a smart sensor device 620, and the data of the communications may be passed through any number of smart sensor devices in a path to reach a fixture having a processor-based device 400 (e.g., small cell networking device).

In the system level deployment 600 of FIG. 6, various ones of the light poles may be 50 feet apart, 100 feet apart, 250 feet apart, or some other distance. In some cases, the type and performance characteristics of each small cell networking device 100 and each smart sensor device 620 are selected based on their respective distance to other such devices such that wireless communications are acceptable.

The light pole and fixture with a processor-based device 400 (e.g., small cell networking device) and each light pole and fixture with a smart sensor device 620 is coupled to a street cabinet 608 or other like structure that provides utility power (e.g., "the power grid") in a wired way. The utility power may provide 120 VAC, 240 VAC, 260 VAC, or some other power source voltage. In addition, the light pole and fixture with a small cell networking device 602, and optionally one or more of the light poles and fixtures with smart sensor devices 604, are also coupled to the same street cabinet 608 or another structure via a wired backhaul connection. It is understood that these wired connections are in some cases separate wired connections (e.g., copper wire, fiber optic cable, industrial Ethernet cable, or the like) and in some cases combined wired connections (e.g., power over Ethernet (PoE), powerline communications, or the like). For simplification of the system level deployment 600 of FIG. 6, the wired backhaul and power line 606 is illustrated as a single line. The street cabinet 608 is coupled to the power grid, which is administered by a licensed power utility agency, and the street cabinet 608 is coupled to the public switched telephone network (PSTN).

Each light pole and fixture 604 with a smart sensor device 620 is in direct or indirect wireless communication with the light pole and fixture with the processor-based device 400 (e.g., small cell networking device). In addition, each light pole and fixture with a smart sensor device 620 and the light pole and fixture with the processor-based device 400 (e.g., small cell networking device) may also be in direct or indirect wireless communication 612 with an optional remote computing device 610.

The remote computing device 610 may be controlled by a mobile network operator (MNO), a municipality, another government agency, a third party, or some other entity. By this optional arrangement the remote computing device 610 can be arranged to wirelessly communicate light control signals and any other information (e.g., packetized data) between itself and each respective wireless networking device coupled to any of the plurality of light poles.

A user 614 holding a mobile computing device 616 is represented in the system level deployment 600 of FIG. 6. A vehicle having an in-vehicle mobile device 618 is also represented. The vehicle may be an emergency service vehicle, a passenger vehicle, a commercial vehicle, a public transportation vehicle, a drone, or some other type of vehicle. The user 614 may use their mobile computing device 616 to establish a wireless communication session over a cellular-based network controlled by an MNO, wherein packetized wireless data is passed through the light pole and fixture with a processor-based device 400 (e.g., small cell networking device). Concurrently, the in-vehicle mobile device 618 may also establish a wireless communication session over the same or a different cellular-based network controlled by the same or a different MNO, wherein packetized wireless data of the second session is also passed through the light pole and fixture with the processor-based device 400 (e.g., small cell networking device).

Other devices may also communicate through light pole-based devices of the system level deployment 600. These devices may be internet of things (IoT) devices or some other types of devices. In FIG. 6, two public information signs and/or a private entity signs are shown, but many other types of devices are contemplated. Each one of these devices has or may otherwise include a smart computing device arranged to form an unlicensed wireless communication session (e.g., WiFi) or a cellular-based wireless communication session with one or more wireless networks made available by the devices shown in the system level deployment 600 of FIG. 6.

The sun and moon 622 are shown in FIG. 6. Light or the absence of light based on time of day, weather, geography, or other causes provide information (e.g., ambient light) to the light sensors of the light pole mounted devices described in the present disclosure. Based on this information, the associated light sources may be suitably controlled.

Figure 7:
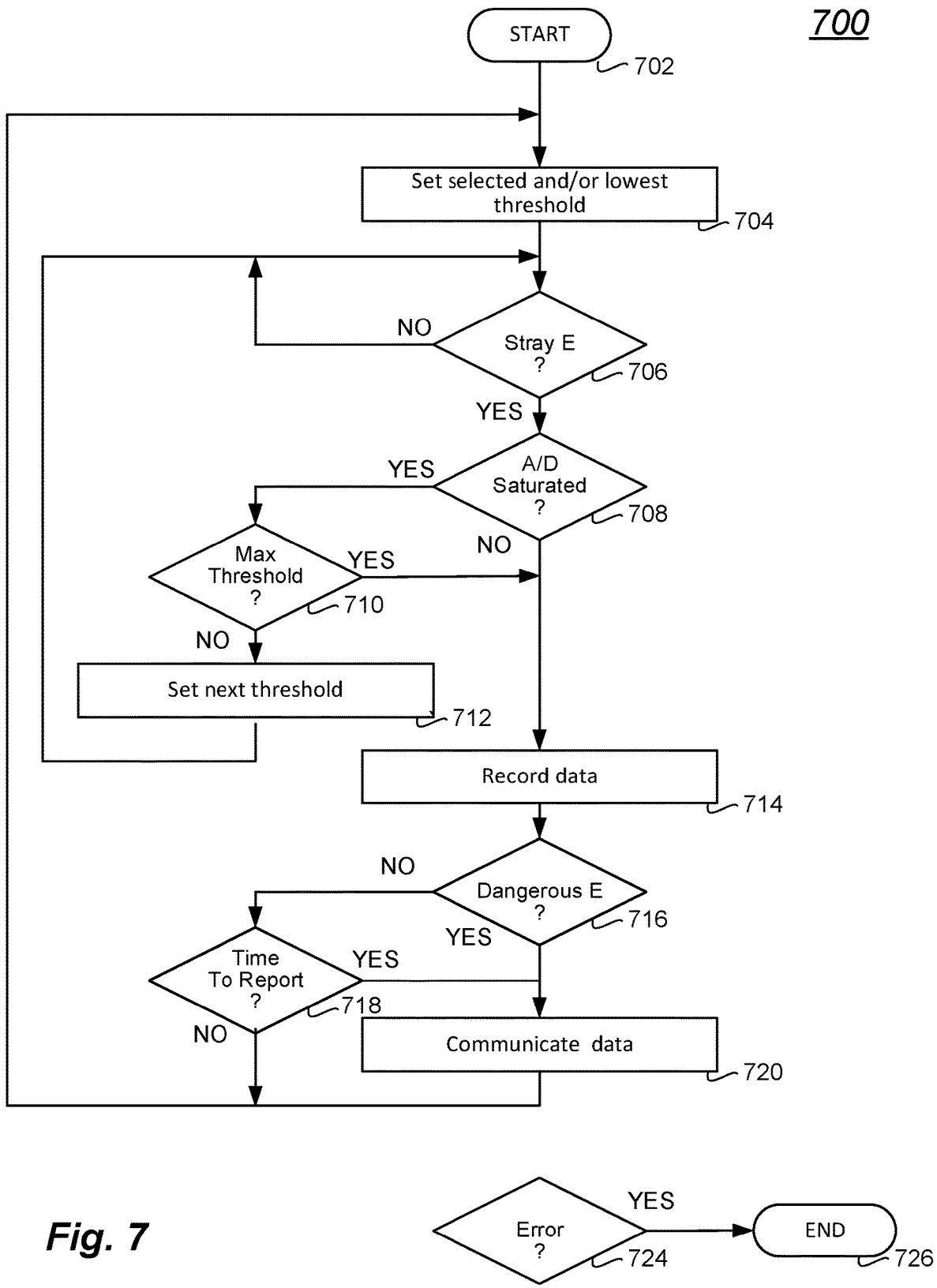
FIG. 7 is a data flow diagram representing processing associated with the stray voltage detection circuit.

FIG. 7 is a data flow diagram (e.g., a flowchart) representing processing associated with the stray voltage detection circuit 252 (FIG. 2B). The processing begins at 702 where the stray voltage detection module is initialized. The initialization may include setting default variable values, configuring the microcontroller 270 input/output module 280 to communicate with the reference voltage selection circuit 266, configuring the microcontroller 270 input/output module 280 to output one or more signals if a stray voltage of a certain threshold is detected, configuring a communications module 276 (e.g., serial or other data transfer port) to communicate with the analog-to-digital (A2D) 268 module, and the like. Processing falls to 704.

At 704, the microcontroller 270 directs a signal to the reference voltage selection circuit 266 to assert a selected reference voltage on the comparator 264. In at least one case, the reference voltage selection circuit 266 is directed to assert a lowest threshold voltage value on the comparator 264.

An output signal from the comparator 264 is sampled by the A2D 268 at 706. The output of the A2D 268 is a digital representation of the amount of stray voltage determined to be present on the neutral line of the device at issue. If no stray voltage is detected, or if any stray voltage is below a particular threshold (e.g., a determined "safe" value), processing continues cyclically in 706. The processing may be interrupt driven, timer driven, or driven in some other way.

If a stray voltage is detected (e.g., if a stray voltage of any amount), the processing advances to 708 where the value produced by the A2D 268 is evaluated. If the value is a saturation value, then the detected stray voltage input is significantly greater than the A2D 268 can represent. The circuit will, in at least some embodiments, attempt to scale the threshold to more accurately determine the amount of stray voltage present on the neutral power line by passing control to 710. Alternatively, if the A2D 268 is not saturated (i.e., the A2D 268 represents a determined voltage value), processing passes from 708 to 714.

In the processing at 710, the current threshold reference voltage coupled to the comparator 264 is evaluated. If the threshold is not at its greatest selected value, then the next higher threshold value is selected, and processing returns to 706 for ongoing stray voltage detection. Alternatively, if the threshold voltage applied to the comparator 264 at its greatest selected value, then the stray voltage value will be determined as a maximum value.

At 714, one or more stray voltage values are optionally recorded. The stray voltage values may be coupled with location data (e.g., global positioning system data) time data, rate of change data, and other such data associated with the stray voltage. In this way, it is recognized that the stray voltage detection circuit 252 of FIG. 2B may be arranged to detect rising stray voltage (e.g., from deteriorating insulation or other slowly occurring failures), and the stray voltage detection circuit 252 of FIG. 2B may be further arranged to detect rapidly rising stray voltage (e.g., a power pole is compromised by an automobile accident). Depending on the type of stray voltage detected, the microcontroller 270 may be arranged to classify with the stray voltage, for example as "safe," "monitor," "dangerous," or the like.

After recording any suitable number of parameters associated with the detected stray voltage at 714, the danger level of the stray voltage is determined at 716. If the voltage has not crossed a selected safety threshold (e.g., "dangerous", greater than a selected voltage, or the like), processing advances to 718. Alternatively processing advances to 720.

At 718, if stray voltage reporting is based on a particular schedule, cycle, or other time parameter, then the elapsed time since a previous reporting is evaluated. If the system will report particular determinations made by or otherwise associated with the stray voltage detection circuit 252, processing passes to 720. Alternatively, processing advances back to 704. Processing of the stray voltage detection circuit is ongoing.

The processing at 720 may include locally reporting a dangerous condition. The local reporting may include any one or more of illuminating a light source as a warning that the associated power pole or other structure may be electrified, activating an audible output warning, transmitting a wireless (e.g., 802.11 WiFI, BLUETOOTH, or the like) warning to all nearby computing devices capable of receiving such a signal, or providing some other local reporting. The processing at 720 may additionally or alternatively include communicating stray voltage information to a remote computing device in a wired, wireless, or wired and wireless manner.

After performing certain communication acts at 620, processing of the stray voltage detection circuit is ongoing and returns to 704. In some cases, where an error is detected (e.g., an uncorrectable error) at 724, processing of the stray voltage detection circuit 252 is terminated.

Having now set forth certain embodiments, further clarification of certain terms used herein may be helpful to providing a more complete understanding of that which is considered inventive in the present disclosure.

Mobile network operators (MNOs) provide wireless cellular-based services in accordance with one or more cellular-based technologies. As used in the present disclosure, "cellular-based" should be interpreted in a broad sense to include any of the variety of technologies that implement wireless or mobile communications. Exemplary cellular-based systems include, but are not limited to, time division multiple access ("TDMA") systems, code division multiple access ("CDMA") systems, and Global System for Mobile communications ("GSM") systems. Some others of these technologies are conventionally referred to as UMTS, WCDMA, 4G, 5G, and LTE. Still other cellular-based technologies are also known now or will be known in the future. The underlying cellular-based technologies are mentioned here for a clearer understanding of the present disclosure, but the inventive aspects discussed herein are not limited to any particular cellular-based technology.

In some cases, cellular-based voice traffic is treated as digital data. In such cases, the term "voice-over-Internet-Protocol", or "VoIP," may be used to mean any type of voice service that is provided over a data network, such as an Internet Protocol (IP) based network. The term VoIP is interpreted broadly to include any system wherein a voice signal from a mobile computing device is represented as a digital signal that travels over a data network. VoIP then may also include any system wherein a digital signal from a data network is delivered to a mobile computing device where it is later delivered as an audio signal.

Connector devices of the types described herein are also commonly referred to as NEMA devices, NEMA compatible devices, NEMA compliant devices, or the like. And these devices include receptacles, connectors, sockets, holders, components, etc. Hence, as used in the present disclosure and elsewhere, those of skill in the art will recognize that coupling the term "NEMA" or the term "ANSI" with any such device indicates a device or structure compliant with a standard promoted by a standards body such as NEMA, ANSI, IEEE, or the like.

A mobile device, or mobile computing device, as the terms are used interchangeably herein, is an electronic device provisioned by at least one mobile network operator (MNO) to communicate data through the MNO's cellular-based network. The data may be voice data, short message service (SMS) data, electronic mail, world-wide web or other information conventionally referred to as "internet traffic," or any other type of electromagnetically communicable information. The data may be digital data or analog data. The data may be packetized or non-packetized. The data may be formed or passed at a particular priority level, or the data may have no assigned priority level at all. A non-comprehensive, non-limiting list of mobile devices is provided to aid in understanding the bounds of the term, "mobile device," as used herein. Mobile devices (i.e., mobile computing devices) include cell phones, smart phones, flip phone, tablets, phablets, handheld computers, laptop computers, body-worn computers, and the like. Certain other electronic equipment in any form factor may also be referred to as a mobile device when this equipment is provisioned for cellular-based communication on an MNO's cellular-based network. Examples of this other electronic equipment include in-vehicle devices, medical devices, industrial equipment, retail sales equipment, wholesale sales equipment, utility monitoring equipment, and other such equipment used by private, public, government, and other entities.

Mobile devices further have a collection of input/output ports for passing data over short distances to and from the mobile device. For example, serial ports, USB ports, WiFi ports, Bluetooth ports, IEEE 1394 FireWire, and the like can communicatively couple the mobile device to other computing apparatuses.

Mobile devices have a battery or other power source, and they may or may not have a display. In many mobile devices, a signal strength indicator is prominently positioned on the display to provide network communication connectivity information to the mobile device user.

A cellular transceiver is used to couple the mobile device to other communication devices through the cellular-based communication network. In some cases, software and data in a file system are communicated between the mobile device and a computing server via the cellular transceiver. That is, bidirectional communication between a mobile device and a computing server is facilitated by the cellular transceiver. For example, a computing server may download a new or updated version of software to the mobile device over the cellular-based communication network. As another example, the mobile device may communicate any other data to the computing server over the cellular-based communication network.

Each mobile device client has electronic memory accessible by at least one processing unit within the device. The memory is programmed with software that directs the one or more processing units. Some of the software modules in the memory control the operation of the mobile device with respect to generation, collection, and distribution or other use of data. In some cases, software directs the collection of individual datums, and in other cases, software directs the collection of sets of data.

Software may include a fully executable software program, a simple configuration data file, a link to additional directions, or any combination of known software types. When the computing server updates software, the update may be small or large. For example, in some cases, a computing server downloads a small configuration data file to as part of software, and in other cases, computing server completely replaces all of the present software on the mobile device with a fresh version. In some cases, software, data, or software and data is encrypted, encoded, and/or otherwise compressed for reasons that include security, privacy, data transfer speed, data cost, or the like.

Processing devices, or "processors," as described herein, include central processing units (CPU's), microprocessors, microcontrollers (MCU), digital signal processors (DSP), application specific integrated circuits (ASIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. A processors may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

As known by one skilled in the art, a computing device, including a mobile computing device, has one or more memories, and each memory may comprise any combination of volatile and non-volatile computer-readable media for reading and writing. Volatile computer-readable media includes, for example, random access memory (RAM). Non-volatile computer-readable media includes, for example, any one or more of read only memory (ROM), magnetic media such as a hard-disk, an optical disk, a flash memory device, a CD-ROM, and the like. In some cases, a particular memory is separated virtually or physically into separate areas, such as a first memory, a second memory, a third memory, etc. In these cases, it is understood that the different divisions of memory may be in different devices or embodied in a single memory. Some or all of the stored contents of a memory may include software instructions executable by a processing device to carry out one or more particular acts.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

FIG. 7 is a data flow diagram (e.g., a flowchart) 700 illustrating processes that may be used by embodiments of computing devices such as the processor-based device 400 of FIG. 4 and other such devices disclosed herein. In this regard, each described process may represent a module, segment, or portion of code, which comprises one or more executable instructions for implementing the specified logical function(s). It should also be noted that in some implementations, the functions noted in the process may occur in a different order, may include additional functions, may occur concurrently, and/or may be omitted.

As used in the present disclosure, the term "module" refers to an application specific integrated circuit (ASIC), an electronic circuit, a processor and a memory operative to execute one or more software or firmware programs, combinational logic circuitry, or other suitable components (hardware, software, or hardware and software) that provide the functionality described with respect to the module.

The terms, "real-time" or "real time," as used herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds or milliseconds), and that the activity may be performed on an ongoing basis (e.g., recording and reporting the collection of utility grade power metering data, recording and reporting IoT data, crowd control data, anomalous action data, and the like). An example of an activity that is not real-time is one that occurs over an extended period of time (e.g., hours or days)] or that occurs based on intervention or direction by a person or other activity.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a small cell networking device may be described as being mounted "substantially horizontal," In these cases, a device that is mounted exactly horizontal is mounted along an "X" axis and a "Y" axis that is normal (i.e., 90 degrees or at right angle) to a plane or line formed by a "Z" axis. Different from the exact precision of the term, "horizontal," and the use of "substantially" or "about" to modify the characteristic permits a variance of the particular characteristic by up to 30 percent. As another example, a small cell networking device having a particular linear dimension of between about six (6) inches and twelve (12) inches includes such devices in which the linear dimension varies by up to 30 percent. Accordingly, the particular linear dimension of the small cell networking device may be between 2.4 inches and 15.6 inches.

The terms "include" and "comprise" as well as derivatives thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as, "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

As described herein, for simplicity, a user is in some case described in the context of the male gender. For example, the terms "his," "him," and the like may be used. It is understood that a user can be of any gender, and the terms "he," "his," and the like as used herein are to be interpreted broadly inclusive of all known gender definitions.

As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

When so arranged as described herein, each computing device may be transformed from a generic and unspecific computing device to a combination device comprising hardware and software configured for a specific and particular purpose. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The use of the phrase "set" (e.g., "a set of items") or "subset," unless otherwise noted or contradicted by context, is to be construed as a nonempty collection comprising one or more members.

The headings and Abstract of the Disclosure provided herein are for convenience only and do not limit or interpret the scope or meaning of the embodiments. The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A processor-based device comprising:
a chassis having a chassis ground node, the chassis ground node arranged to electrically couple the chassis to an earth ground;
a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors support a powerline interface, and wherein the powerline interface includes at least a hot power signal, a load power signal, and a neutral power signal;
first circuitry to convert alternating current (AC) power received at the first connector into direct current (DC) power and to provide a digitally stable ground node;
a processor-based apparatus housed at least in part within the chassis, the processor-based apparatus arranged to operate using the DC power and the digitally stable ground node;
second circuitry to detect a stray voltage potential between the neutral power signal of the powerline interface and the chassis ground node; and
means for communicating at least one indication of the stray voltage potential.

2. The processor-based device of claim 1, wherein the powerline interface conforms to a standard provided by the National Electrical Manufacturers Association (NEMA).

3. The processor-based device of claim 1, wherein the second connector is integrated in a luminaire.

4. The processor-based device of claim 1, wherein the first circuitry comprises:
circuitry inputs arranged to receive mains power via the first connector;
a first ground node;
a second ground node;
a transformer arranged to galvanically isolate the first ground node from the second ground node;
a first set of electrical components arranged to rectify and filter the mains power and further arranged to provide the filtered and rectified power to a primary winding of the transformer;
a solid-state switching device electrically coupled between the primary winding and the first ground node;
a pulse width modulation (PWM) controller arranged to control switching of the solid-state switching device;
a second set of electrical components electrically coupled to a secondary winding of the transformer and arranged to provide a filtered DC voltage relative to the second ground node, the filtered DC voltage electrically coupled to a DC output node; and
a third set of electrical components electrically coupled between the second ground node and the digitally stable ground node, wherein the digitally stable ground node is galvanically isolated from a mains power ground node.

5. The processor-based device of claim 4, wherein the first circuitry further comprises:
an error compensation sub-circuit arranged to provide an error signal based at least in part on the filtered DC voltage, the error compensation sub-circuit coupled to the second ground node; and
an optical isolator arranged to provide a feedback signal to the PWM controller based at least in part on the error signal.

6. The processor-based device of claim 1, wherein the second circuitry comprises:
a stray voltage isolation circuit arranged to generate a stray voltage signal; and
a stray voltage measurement/processing circuit arranged to:
programmatically set a stray voltage threshold;
determine whether the stray voltage signal has crossed the stray voltage threshold; and
communicate an alert responsive to determining that the stray voltage signal has crossed the stray voltage threshold.

7. The processor-based device of claim 6, wherein the stray voltage isolation circuit includes at least one Zener diode arranged to provide a regulated stray voltage signal.

8. The processor-based device of claim 6, wherein the alert includes at least one of an audio alert, a visual alert, and a short-range wireless alert.

9. The processor-based device of claim 8, wherein the short-range wireless alert includes a packetized message communicated toward mobile computing devices wirelessly coupled to the processor-based device.

10. The processor-based device of claim 6, wherein the alert includes at least one packetized message communicated toward a remote computing device via a cellular-based communication medium.

11. The processor-based device of claim 1, wherein the first circuitry comprises:
a pair of circuitry inputs, wherein a first circuitry input of the pair of circuitry inputs is connected to a first connector element of the set of first connector elements and wherein a second circuitry input of the pair of circuitry inputs is connected to a second connector element of the set of first connector elements;
a first ground node;
a second ground node galvanically isolated from the first ground node;
a transformer that galvanically isolates the first ground node from the second ground node, the transformer including a primary winding, a secondary winding coupled to the second ground node, and an auxiliary winding coupled to the first ground node;
a first set of electrical components arranged to rectify and filter the mains power and provide the filtered and rectified power to the primary winding of the transformer;
a solid-state switching device connected between the primary winding of the transformer and the first ground node;
a pulse width modulation (PWM) controller that controls switching of the solid-state switching device, the PWM controller coupled to the first ground node and powered by power received from the auxiliary winding of the transformer;
an output capacitor and a diode coupled to the secondary winding of the transformer and providing a DC voltage output relative to the second ground node;
an error compensation subcircuit that provides an error signal based at least in part on the DC voltage output, the error compensation subcircuit coupled to the second ground node; and an optical isolator that provides a feedback signal to the PWM controller based at least in part on the error signal; and
a DC output node.

12. The processor-based device of claim 1, wherein the second circuitry comprises:
a stray voltage isolation circuit arranged to generate a stray voltage signal; and
a stray voltage measurement/processing circuit arranged to:
programmatically set a stray voltage threshold;
determine whether the stray voltage signal has crossed the stray voltage threshold; and
communicate an alert responsive to determining that the stray voltage signal has crossed the stray voltage threshold.

13. The processor-based device of claim 12, wherein the stray voltage isolation circuit includes at least one Zener diode arranged to provide a regulated stray voltage signal.

14. The processor-based device of claim 12, wherein the alert includes at least one of an audio alert, a visual alert, and a wireless message alert.

15. A processor-based device comprising:
a chassis having a chassis ground node, the chassis ground node arranged to electrically couple the chassis to an earth ground;
a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors support a powerline interface, and wherein the powerline interface includes at least a hot power signal, a load power signal, and a neutral power signal;
first circuitry to convert alternating current (AC) power received at the first connector into direct current (DC) power and to provide a digitally stable ground, the first circuitry including:
circuitry inputs arranged to receive mains power via the first connector;
a first ground node;
a second ground node;
a transformer arranged to galvanically isolate the first ground node from the second ground node;
a first set of electrical components arranged to rectify and filter the mains power and provide the filtered and rectified power to a primary winding of the transformer;
a solid-state switching device electrically coupled between the primary winding of the transformer and the first ground node;
a pulse width modulation (PWM) controller arranged to control switching of the solid-state switching device;
a second set of electrical components electrically coupled to a secondary winding of the transformer and arranged to provide a filtered DC voltage relative to the second ground node, the filtered DC voltage electrically coupled to a DC output node; and
a third set of electrical components electrically coupled between the second ground node and the digitally stable ground, wherein the digitally stable ground is galvanically isolated from a mains power ground node;

a processor-based apparatus housed at least in part within the chassis, the processor-based apparatus arranged to operate using the DC power and the digitally stable ground;

second circuitry to detect a stray voltage potential between the neutral power signal of the powerline interface and the chassis ground node; and means for communicating at least one indication of the stray voltage potential.

16. The processor-based device of claim 15, wherein the second circuitry comprises:

a stray voltage isolation circuit arranged to generate a stray voltage signal; and a stray voltage measurement/processing circuit arranged to:

programmatically set a stray voltage threshold;

determine whether the stray voltage signal has crossed the stray voltage threshold; and communicate an alert responsive to determining that the stray voltage signal has crossed the stray voltage threshold.

17. The processor-based device of claim 16, wherein the stray voltage isolation circuit includes at least one Zener diode arranged to provide a regulated stray voltage signal and wherein the alert includes at least one of an audio alert, a visual alert, and a wireless alert.

18. A processor-based device comprising:

a chassis having a chassis ground node, the chassis ground node arranged to electrically couple the chassis to an earth ground;

a first connector accessible from an exterior of the chassis, the first connector including a set of first connector elements arranged to interface with a corresponding set of second connector elements of a second connector, wherein the first and second connector elements include a plurality of electrical signal conduits, wherein the first and second connectors support a powerline interface, and wherein the powerline interface includes at least a hot power signal, a load power signal, and a neutral power signal;

first circuitry to convert alternating current (AC) power received at the first connector into direct current (DC) power and to provide a digitally stable ground galvanically isolated from a mains power ground node, the first circuitry including:

a pair of circuitry inputs, wherein a first circuitry input of the pair of circuitry inputs is connected to a first connector element of the set of first connector elements and wherein a second circuitry input of the pair of circuitry inputs is connected to a second connector element of the set of first connector elements;

a first ground node;

a second ground node galvanically isolated from the first ground node;

a transformer that galvanically isolates the first ground node from the second ground node, the transformer including a primary winding, a secondary winding coupled to the second ground node, and an auxiliary winding coupled to the first ground node;

a first set of electrical components arranged to rectify and filter the mains power and provide the filtered and rectified power to the primary winding of the transformer;

a solid-state switching device connected between the primary winding of the transformer and the first ground node;

a pulse width modulation (PWM) controller that controls switching of the solid-state switching device, the PWM controller coupled to the first ground node and powered by power received from the auxiliary winding of the transformer;

an output capacitor and a diode coupled to the secondary winding of the transformer and providing a DC voltage output relative to the second ground node;

an error compensation subcircuit that provides an error signal based at least in part on the DC voltage output, the error compensation subcircuit coupled to the second ground node;

an optical isolator that provides a feedback signal to the PWM controller based at least in part on the error signal; and a DC output node;

a processor-based apparatus housed at least in part within the chassis, the processor-based apparatus arranged to operate using the DC power and the digitally stable ground;

second circuitry to detect a stray voltage potential between the neutral power signal of the powerline interface and the chassis ground node; and means for communicating at least one indication of the stray voltage potential.

19. The processor-based device of claim 18, wherein the second circuitry comprises:

a stray voltage isolation circuit arranged to generate a stray voltage signal; and a stray voltage measurement/processing circuit arranged to:

programmatically set a stray voltage threshold;

determine whether the stray voltage signal has crossed the stray voltage threshold; and communicate an alert responsive to determining that the stray voltage signal has crossed the stray voltage threshold.

20. The processor-based device of claim 19, wherein the stray voltage isolation circuit includes at least one Zener diode arranged to provide a regulated stray voltage signal and wherein the alert includes at least one of an audio alert, a visual alert, and a wireless message alert.

* * * * *